United States Patent
Kasai

(10) Patent No.: US 8,140,280 B2
(45) Date of Patent: Mar. 20, 2012

(54) BATTERY CONDITION DIAGNOSIS APPARATUS

(75) Inventor: Eiji Kasai, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 993 days.

(21) Appl. No.: 12/089,614

(22) PCT Filed: Oct. 19, 2006

(86) PCT No.: PCT/JP2006/321310
§ 371 (c)(1),
(2), (4) Date: Apr. 9, 2008

(87) PCT Pub. No.: WO2007/055101
PCT Pub. Date: May 18, 2007

(65) Prior Publication Data
US 2009/0259419 A1 Oct. 15, 2009

(30) Foreign Application Priority Data
Nov. 9, 2005 (JP) ................................ 2005-324411
Nov. 9, 2005 (JP) ................................ 2005-324416

(51) Int. Cl.
*G01R 31/36* (2006.01)
(52) U.S. Cl. ............ 702/63; 702/65; 702/182; 320/134; 320/136; 340/636.15
(58) Field of Classification Search .............. 702/63–65; 320/134, 136; 340/636.1, 636.11–636.13, 340/636.15
See application file for complete search history.

(56) References Cited

U.S. PATENT DOCUMENTS

| 7,173,397 B2* | 2/2007 | Kinoshita et al. ............. 320/134 |
| 2003/0034780 A1* | 2/2003 | Vacher .......................... 324/427 |
| 2006/0197503 A1* | 9/2006 | Arai et al. ..................... 320/132 |

FOREIGN PATENT DOCUMENTS

| DE | 199 60 289 | 6/2000 |
| EP | 0 243 181 | 10/1987 |
| JP | 10 170616 | 6/1998 |
| JP | 2000 190793 | 7/2000 |
| JP | 2002 286817 | 10/2002 |
| JP | 2002 354703 | 12/2002 |
| JP | 2003-115331 | 4/2003 |
| JP | 2003-120437 | 4/2003 |
| JP | 2003 319503 | 11/2003 |
| JP | 2004 9871 | 1/2004 |
| JP | 2004-266992 | 9/2004 |
| JP | 2005 28900 | 2/2005 |
| JP | 2005-30291 | 2/2005 |
| JP | 2005-57880 | 3/2005 |
| JP | 2005-229661 | 8/2005 |

* cited by examiner

Primary Examiner — Manuel L Barbee
(74) Attorney, Agent, or Firm — Oblon, Spivak, McClelland, Maier & Neustadt, L.L.P.

(57) ABSTRACT

A battery condition diagnosis apparatus for a vehicle gradually supplies electricity to an electric motor of an electric power steering apparatus when a predetermined time elapses after an ignition switch is turned off. The apparatus diagnoses the deteriorated condition of the battery on the basis of the amount of supplied electricity and the detected battery voltage which changes in accordance therewith. The electric motor may be a brushless DC motor. In this case, current is supplied to the electric motor such that only d-axis armature current Id in the d-q coordinate system flows, to thereby prevent the electric motor from rotating, whereby safety is secured. Accordingly, the condition of the battery can be accurately diagnosed by supplying electricity to the electric motor without changing the condition of the vehicle.

18 Claims, 13 Drawing Sheets

BATTERY CONDITION DIAGNOSIS APPARATUS

TECHNICAL FIELD

The present invention relates to a battery condition diagnosis apparatus for diagnosing the condition of a battery which supplies electrical power to a plurality of electrical control systems provided in a vehicle.

BACKGROUND ART

Conventionally, an electric power steering apparatus has been known as one example of an electrical control system to which electrical power is supplied from a battery mounted on a vehicle. This electric power steering apparatus, which controls the amount of electricity supplied to an electric motor in accordance with the operation condition of a steering wheel to thereby impart steering torque, consumes a considerably large amount of electrical power. Therefore, when the capacity of a battery lowers (hereinafter referred to as "deterioration"), a limitation is imposed on the amount of electricity supplied to the electric motor, which generates the steering torque, with the result that the motor may fail to generate a predetermined steering torque, and a drop may occur in the voltage supplied to other electrical control systems operating simultaneously.

Accordingly, it is important to detect deterioration of the battery before such a situation occurs, and to prompt a driver to exchange the battery.

An apparatus for detecting deterioration of a battery mounted on a vehicle is disclosed in, for example, JP2000-190793A. The disclosed apparatus is configured such that current is supplied from a battery to a predetermined load during a period between turning on of a key switch that detects insertion of a start key and turning on of an ignition switch that starts an engine, and the battery condition is diagnosed on the basis of a change in the battery voltage at that time.

Further, an apparatus disclosed in JP2005-28900A includes two electric motors for steering wheels, and diagnoses the battery condition on the basis of a drop in the battery terminal voltage at the time when a large current is supplied from the battery to the electric motors.

DISCLOSURE OF THE INVENTION

However, in the case of the apparatus disclosed in JP2000-190793A, since the period between turning on of the key switch and turning on of the ignition switch is short, accurate diagnosis cannot be performed. Therefore, the timing at which battery replacement is prompted becomes improper; i.e., too early or too late. Further, in a case where the result of diagnosis of the battery is used to restrict the operation of the electric power steering apparatus, the restriction on the amount of electricity supplied to the electric motor becomes excessive, with the result that sufficient steering torque cannot be obtained, or the restriction on the amount of supplied electricity becomes insufficient, with the result that the battery voltage drops drastically, which adversely affects operations of other electrical control systems.

Further, in the apparatus disclosed in JP2005-28900A, in order to prevent steering of the wheels during diagnosis of the battery condition, one of the two motors is driven in a direction for rightward steering, and the other motor is driven in a direction for leftward steering. Accordingly, two independent electric motors are required for performing battery diagnosis, and the disclosed apparatus cannot be applied to common systems which do not have such a configuration.

The present invention has been accomplished to cope with the above-described problems, and an object of the present invention is to provide a battery condition diagnosis apparatus which can accurately diagnose the condition of a battery and which can diagnose the condition of a battery by supplying electricity to an electric motor without changing the condition of a vehicle even when the vehicle condition control apparatus of the vehicle does not include a plurality of electric motors.

In order to accomplish the above-described object, the present invention provides a battery condition diagnosis apparatus for diagnosing the condition of a battery which supplies electrical power to a plurality of electrical control systems provided in a vehicle, the apparatus comprising electrification means for supplying electricity, in a predetermined manner, to a specific one of the plurality of electrical control systems when a predetermined time elapses after an ignition switch is turned off; electricity-supplied-amount detection means for detecting, as an electricity supplied amount, an amount of current flowing through the specific electrical control system; voltage change detection means for detecting a voltage change of the battery when the electrification means supplies electricity to the specific electrical control system; and battery condition diagnosis means for diagnosing the condition of the battery on the basis of the detected electricity supplied amount and the detected voltage change of the battery.

According to the battery condition diagnosis apparatus of the present invention configured as described above, electricity is supplied to the specific electrical control system by means of the electrification means after the supply of power to the various electrical control systems is stopped by turning off the ignition switch, and the condition of the battery is diagnosed on the basis of the electricity supplied amount and the battery voltage change at that time. Therefore, the battery diagnosis is not adversely affected by operation of the remaining electrical control systems, and a sufficiently long time can be used for the diagnosis, whereby accurate diagnosis results can be obtained.

The electrification means may be configured to supply electricity to an electrical load, such an electric actuator, of the specific electrical control system when the predetermined time elapses after the ignition switch is turned off.

Notably, the determination as to whether or not the predetermined time elapses after the ignition switch is turned off can be made by means of measuring the passage of time by use of a timer, or by means of detecting a specific physical phenomenon. For example, the predetermined time can be determined to have elapsed by means of detecting that the ambient temperature of the engine has decreased to a predetermined temperature.

Another feature of the present invention resides in that the electrification means gradually increases the amount of electricity supplied to the specific electrical control system.

By virtue of this configuration, the amount of electricity supplied to the specific electrical control system is gradually increased, whereby problems such as abrupt drop in the battery voltage can be prevented. That is, when the battery has deteriorated considerably, the battery voltage sharply drops upon supply of electricity in the predetermined manner, and the full-time electricity supply system of the vehicle may fail. The apparatus of the present invention can prevent occurrence of such a problem.

Another feature of the present invention resides in that the specific electrical control system is an electric power steering apparatus including an electric motor for imparting a predetermined steering torque to a steerable wheel to be steered, and motor control means for controlling the electric motor in accordance with an operation condition of a steering wheel while detecting the amount of electricity supplied to the electric motor by means of a current sensor.

In general, an electric power steering apparatus includes a current sensor (electricity-supplied-amount detection means) which detects the amount of electricity supplied to the electric motor. Therefore, the battery condition can be diagnosed by effectively utilizing the current sensor. Accordingly, additional provision of a special current sensor is not required, and the battery condition can be diagnosed at low cost.

In addition, in the electric power steering apparatus, a large amount of electricity, is supplied to the electric motor. Therefore, at the time of battery diagnosis as well, a large current can be supplied to the electric motor, whereby the battery diagnosis can be performed to a sufficient degree. That is, in order to perform the battery diagnosis, a large current must be taken out of the battery. From this point of view, the electric power steering apparatus is an optimum load for the battery diagnosis, because the electric power steering apparatus is designed to supply a large current to the electric motor to operate.

Another feature of the present invention resides in that the electric motor is a brushless DC motor; the motor control means serves as the electrification means so as to supply electricity to the motor at the time of the battery condition diagnosis such that only d-axis armature current flows in a d-q coordinate system composed of a d-axis, which is an axis of action of magnetic flux produced by a permanent magnet of a rotor of the brushless DC motor, and a q-axis perpendicular to the d-axis, and that no q-axis armature current flows.

According to the apparatus of the present invention configured as described above, when the battery condition is diagnosed, the motor control means supplies electricity to the brushless DC motor such that only d-axis armature current in the d-q coordinate system of the brushless DC motor flows, and therefore, no rotational torque is generated.

In general, torque of a brushless DC motor in the form of a permanent magnet synchronous motor is proportional to the product of the armature-coil flux linkage and the q-axis armature current in the d-q coordinate system, and is not affected by the d-axis armature current.

Since the electric motor does not rotate at the time of the battery diagnosis, no steering torque is generated, so that the steering wheel does not rotate. Therefore, the battery condition can be diagnosed, while safety is secured for the driver.

Another feature of the present invention resides in that the motor control means intermittently supplies electricity to the electric motor. This configuration can suppress the power consumption of the battery.

Another feature of the present invention resides in that the motor control means continuously supplies electricity to the electric motor. That is, the electrification means gradually increases the amount of supplied electricity in a single electrification operation such that the current flowing through the electric motor reaches a predetermined level. With this configuration, since the electrification time increases, a chemical reaction occurs to a sufficient degree within the battery, whereby the accuracy of the battery diagnosis is improved. Further, since the battery condition is diagnosed under conditions close to an environment in which the battery is actually used, the accuracy of the diagnosis is improved.

Another feature of the present invention resides in provision of storage means for storing battery voltage change data representing a voltage change of the battery at the time of the battery condition diagnosis, and the battery condition diagnosis means diagnosing the condition of the battery on the basis of the stored past battery voltage change data and a voltage change of the battery at the time of the present diagnosis.

By virtue of this configuration, a deteriorated condition can be diagnosed in a manner suitable for a battery actually used. That is, since batteries have individual differences in terms of battery characteristics, diagnosis on the basis of a battery voltage change reference value uniformly determined among the batteries is not preferred. Therefore, the condition of a battery currently used can be properly diagnosed by comparing the stored past battery voltage change data of the battery and a voltage change of the battery at the time of the present diagnosis.

For example, the highest value of the battery voltage detection values measured during past diagnosis is stored as a voltage detection value in the initial condition of the battery (i.e., when the battery is new), and the voltage detection value in the initial condition is compared with the voltage detection value measured this time. This operation enables diagnosing the present deteriorated condition in relation to the initial condition of the battery.

Another feature of the present invention resides in provision of upper limit current determination means for determining, on the basis of the diagnosed battery condition, an upper limit current which can be supplied to the electric motor of the electric power steering apparatus.

By virtue of this configuration, since the upper limit current is properly set by means of accurate diagnosis of the battery condition, excessive restriction on the amount of electricity supplied to the electric motor is prevented, and proper steering assist torque can be obtained. Further, the upper limit current supplied to the electric motor is prevented from being set to an excessively high level, which would otherwise excessively suppress the amount of power supplied to other electrical control systems. As a result, the limited power of the battery can be distributed to the electrical control systems in a well-balanced manner.

Another feature of the present invention resides in that in the case where the period between a turning off operation of the ignition switch and the next turning on operation of the ignition switch exceeds a predetermined time, the results of the battery condition diagnosis performed up to the previous time are invalidated.

For example, when the vehicle is not used for six months, the condition of the battery at startup has greatly changed from the condition six months previously, and therefore, the battery voltage change data up to the immediately previous time are ignored. Accordingly, it becomes possible to avoid restricting the upper limit current of the electric motor of the electric power steering apparatus.

Another feature of the present invention lies in provision of pre-electrification voltage detection means for detecting the battery voltage before the electrification means supplies electricity to the specific electrical control system; and electrification diagnosis permission means for permitting the supply of electricity by the electrification means, only when the battery voltage before the supply of electricity is equal to or higher than a reference voltage, to thereby start the diagnosis of the battery condition.

By virtue of this configuration, for a battery which can be determined to have deteriorated without diagnosis; i.e., a battery whose voltage is lower than the reference voltage even before the electrification, the diagnosis can be interrupted.

Therefore, it is possible to prevent the residual capacity of the battery from decreasing further, which would otherwise occur due to the electrification for the diagnosis.

Another feature of the present invention resides in that, after the diagnosis is started upon supply of electricity by the electrification means, when the battery voltage becomes lower than a predetermined voltage in the middle of the diagnosis, the battery condition diagnosis means stops the supply of electricity by the electrification means, and ends the diagnosis.

By virtue of this configuration, in the case where the battery voltage becomes lower than the predetermined voltage in the middle of the diagnosis, the battery is determined to be in a deteriorated condition, and further electrification is not performed. Therefore, it is possible to prevent the residual capacity of the battery from decreasing further, which would otherwise occur due to continued electrification.

Another feature of the present invention resides in that, after the diagnosis is started upon supply of electricity by the electrification means, when the battery voltage is equal to or higher than a predetermined voltage set in accordance with the electricity supplied amount, the battery condition diagnosis means determines that the battery is in a good condition, stops the supply of electricity by the electrification means, and ends the diagnosis.

By virtue of this configuration, in the case where, after the supply of electricity to the specific electrical control system is started, the battery voltage is confirmed to be equal to or higher than a predetermined voltage set in accordance with the electricity supplied amount, the battery is determined at that point in time to be in a good condition, and the diagnosis is ended. Therefore, excessive supply of electricity to the specific electrical control system is prevented, and the consumption of electrical power of the battery associated with the diagnosis can be suppressed.

Another feature of the present invention resides in that the motor control means supplies electricity to the electric motor of the electric power steering apparatus after confirming, on the basis of a detection signal from key detection means for detecting insertion and removal of the ignition key, that the ignition key has been removed.

When the ignition key is removed, the steering wheel is locked. Therefore, even when electricity is supplied to the electric motor during the battery diagnosis, the steering wheel does not rotate, and safety can be secured even if a person sits in the driver's seat. In addition, since the steering wheel is not steered by the driver, no regenerative power is generated from the electric motor, so that the results of the battery diagnosis become accurate.

The present invention also provides a battery condition diagnosis apparatus for a vehicle which comprises vehicle-condition control means including an electric motor and motor control means for driving and controlling the electric motor and adapted to control the condition of the vehicle, and a battery for supplying electrical power to the vehicle-condition control means, wherein the battery condition diagnosis apparatus diagnoses the condition of the battery on the basis of a voltage change of the battery when electricity is supplied from the battery to the electric motor. The battery condition diagnosis apparatus is characterized in that the electric motor is composed of a brushless DC motor, and the motor control means includes d-axis electrification control means for supplying electricity to the electric motor at the time of the battery condition diagnosis such that only d-axis armature current flows in a d-q coordinate system composed of a d-axis, which is an axis of action of magnetic flux produced by a permanent magnet of a rotor of the brushless DC motor, and a q-axis perpendicular to the d-axis, and that no q-axis armature current flows.

According to the apparatus of the present invention configured as described above, when the battery condition is diagnosed, the d-axis electrification control means electrifies the brushless DC motor such that only d-axis armature current in the d-q coordinate system of the brushless DC motor flows, and therefore, no rotational torque is generated.

In general, torque of a brushless DC motor in the form of a permanent magnet synchronous motor is proportional to the product of the armature-coil flux linkage and the q-axis armature current in the d-q coordinate system, and is not affected by the d-axis armature current.

Accordingly, by means of electrification performed such that the d-axis armature current of the brushless DC motor flows, current can be taken out of the battery without changing the vehicle condition. The battery condition diagnosis apparatus diagnoses the condition of the battery on the basis of the change in the battery voltage at that time.

As a result, it become possible to take current out of the battery without changing the vehicle condition and to diagnose the battery condition, without the necessity of electrifying a plurality of electric motors in combination as in the conventional apparatus. Therefore, the battery condition diagnosis apparatus of the present invention has a high degree of versatility.

For example, in the case where the brushless DC motor is composed of a three-phase synchronous permanent magnetic motor, preferably, the d-axis electrification control means includes a two-phase/three-phase conversion means for converting two-phase instruction currents (Id*, Iq*) in the d-q coordinate system to three-phase armature currents (Iu, Iv, Iw); and motor rotational angle (magnet position) detection means for determining phases of currents to be supplied to the motor.

Further, preferably, the diagnosis of the battery condition is performed on the basis of the amount of electricity (current) supplied from the battery to the electric motor and a measured value of the battery voltage at that time.

Another feature of the present invention resides in that the d-axis electrification control means restricts the d-axis armature current to a predetermined upper limit current value or less.

In the case of the brushless DC motor, when excessively large d-axis armature current flows, the permanent magnet provided on the rotor is demagnetized. In the present invention, since an upper limit is set for the d-axis armature current, such a problem can be avoided.

Another feature of the present invention resides in provision of temperature detection means for detecting temperature of the brushless DC motor through measurement or estimation, and the d-axis electrification control means setting the upper limit current value on the basis of the detected temperature.

The permanent magnet provided on the rotor of the brushless DC motor has properties such that it becomes more likely to be demagnetized at high temperature or at low temperature, depending on the type of the magnetic material. For example, a rare-earth magnet is likely to be demagnetized at high temperature, and a ferrite magnet is likely to be demagnetized at low temperature. In view of this, in the present invention, the temperature of the motor is detected, and the upper limit of the d-axis armature current is set in accordance with the detected temperature. Therefore, demagnetization of the magnet can be prevented without fail.

Another feature of the present invention resides in that the vehicle condition control means is an electric power steering apparatus which drives and controls the brushless DC motor in accordance with an operation condition of a steering wheel so as to impart a predetermined steering force to steerable wheels to be steered.

In an electric power steering apparatus, a large amount of electricity is supplied to the electric motor. Therefore, at the time of battery diagnosis as well, a large current can be supplied to the electric motor, whereby the battery diagnosis can be performed to a sufficient degree. That is, in order to perform the battery diagnosis, a large current must be taken out of the battery. From this point of view, the electric power steering apparatus is an optimum load for the battery diagnosis, because the electric power steering apparatus is designed to supply a large current to the electric motor to operate.

In addition, in general, an electric power steering apparatus includes a current sensor for accurately controlling the amount of electricity supplied to the electric motor. Therefore, the battery condition can be diagnosed by effectively utilizing the current sensor. Accordingly, additional provision of a special current sensor is not required, and the battery condition can be diagnosed at low cost.

Moreover, even when electricity is supplied to the electric motor during the battery diagnosis, the electric motor does not rotate. Therefore, no steering torque is generated, and the steering wheel does not rotate. As a result, the battery condition can be diagnosed, while safety is secured for the driver.

BEST MODE FOR CARRYING OUT THE INVENTION

Figure 1:
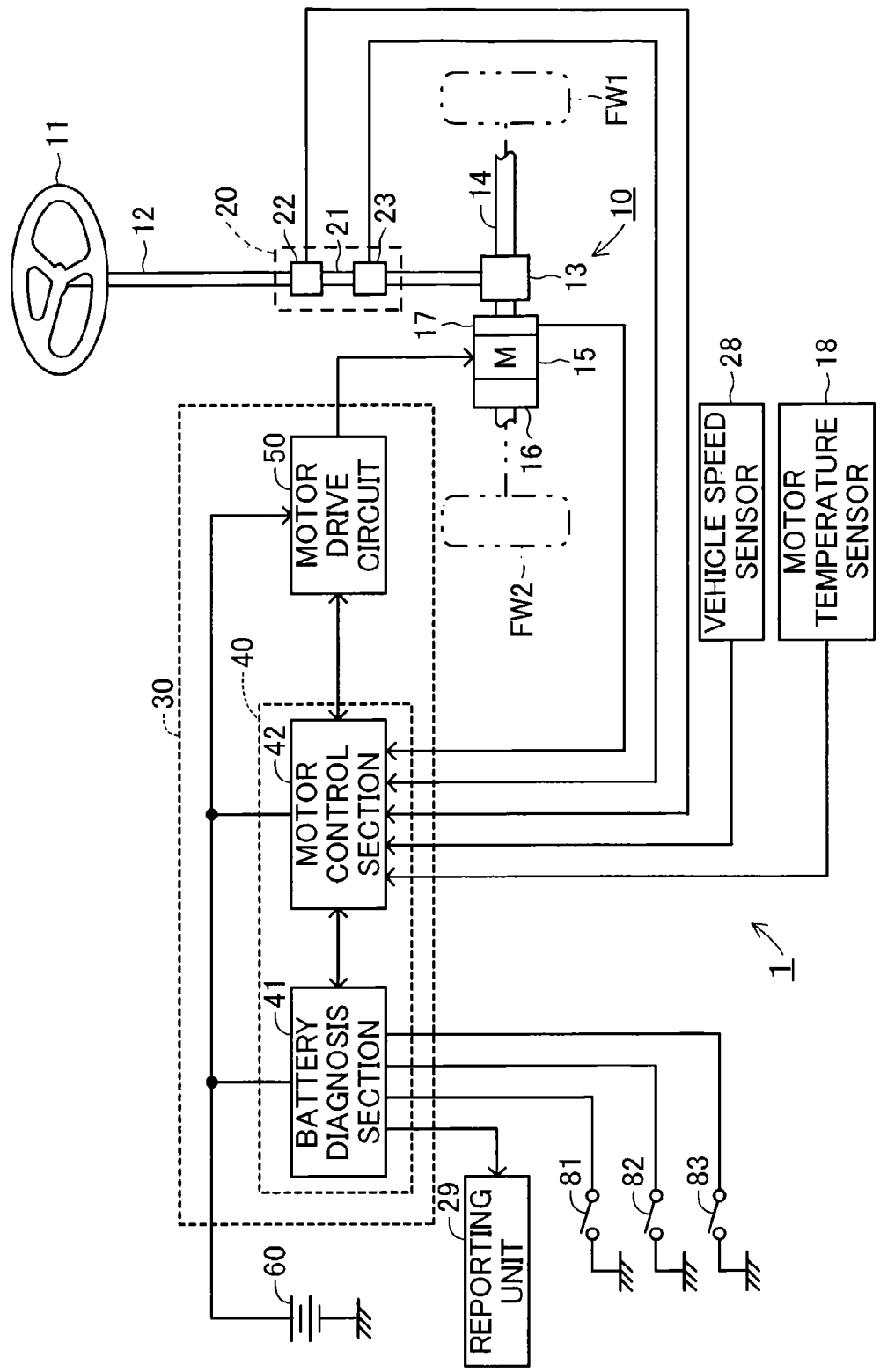
FIG. 1 is a diagram showing the overall configuration of an electric power steering apparatus equipped with a battery condition diagnosis apparatus according to an embodiment of the present invention.

An electric power steering apparatus equipped with a battery condition diagnosis apparatus according to one embodiment of the present invention will now be described with reference to the drawings. FIG. 1 schematically shows the electric power steering apparatus according to the embodiment.

This power steering apparatus, which is denoted by reference numeral 1, is mainly composed of a steering assist mechanism 10 for imparting steering assist force to steerable wheels to be steered; and an assist control apparatus 30 for driving and controlling an electric motor 15 of the steering assist mechanism 10.

The steering assist mechanism 10 converts rotation of a steering shaft 12 about its axis, which is caused by rotational operation of a steering wheel 11, into motion of a rack bar 14 along its axis by means of a rack-and-pinion mechanism, whereby left and right front wheels FW1 and FW2 are steered in accordance with the axial motion of the rack bar 14. The electric motor 15 is assembled to the rack bar 14. The electric motor 15 axially drives the rack bar 14 via a ball screw mechanism 16 by means of its rotation, to thereby impart assist force thereto in accordance with the rotational operation of the steering wheel 11. A rotational angle sensor 17 is attached to the electric motor 15, and a steering torque sensor 20 is assembled to a lower end portion of the steering shaft 12.

The rotational angle sensor 17, which is composed of a resolver, detects rotational angle of the electric motor 15, and outputs a detection signal indicative of the detected rotational angle. The steering torque sensor 20 is composed of a torsion bar 21 which is interposed in the steering shaft 12 and whose upper and lower end portions are connected to the steering shaft 12, and resolvers 22 and 23 assembled to the upper and lower end portions, respectively, of the torsion bar 21. The resolvers 22 and 23 detect rotational angles of the upper and lower ends, respectively, of the torsion bar 21, and output respective detection signals representing the detected rotational angles.

The assist control apparatus 30 is composed of an electronic control apparatus 40, whose main portion is composed of a microcomputer, and a motor drive circuit 50 for driving and controlling the electric motor 15 in accordance with control signals from the electronic control apparatus 40. From the viewpoint of functions, the electronic control apparatus 40 includes a battery diagnosis section 41 and a motor control section 42.

The motor control section 42 determines the amount of electricity supplied to the electric motor 15 on the basis of detection signals from the rotational angle sensor 17, the steering torque sensor 20, and a vehicle speed sensor 28 for detecting speed of the vehicle, and controls the motor drive section 50 so as to generate a predetermined steering assist force. Further, a motor temperature sensor 18 is connected to the motor control section 42 so as to set an upper limit of d-axis armature current to be described later.

Meanwhile, the battery diagnosis section 41 supplies electricity to the electric motor 15 via the motor control section 42 and diagnoses the condition of a battery 60. A door switch 81 for detecting opening and closing a door, a door lock switch 82 for detecting a locked state of the door, and a key switch 83 for detecting insertion and removal of an ignition key are connected to the battery diagnosis section 41 so as to check the condition of the vehicle as diagnosis start conditions. Further, a reporting unit 29 for reporting diagnosis results to a driver is also connected to the battery diagnosis section 41.

Figure 2:
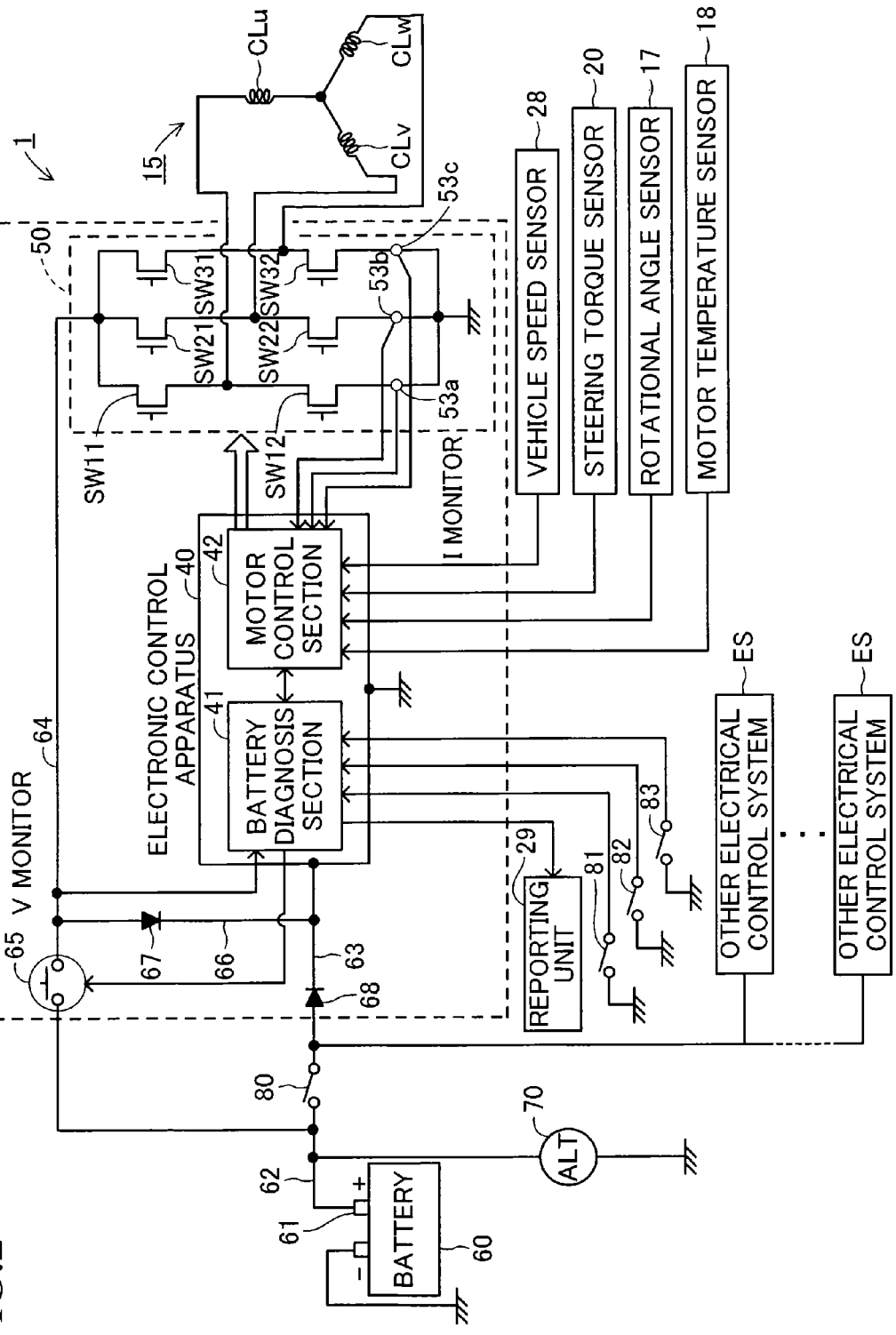
FIG. 2 is a schematic circuit diagram mainly showing the power supply system of the electric power steering apparatus.

As shown in FIG. 2, the motor drive circuit 50 constitutes a three-phase inverter circuit, and includes switching elements SW11, SW12, SW21, SW22, SW31, and SW32, which correspond to individual coils CLu, CLv, and CLw of the electric motor 15. In the present embodiment, each of the switching elements SW11, SW12, SW21, SW22, SW31, and SW32 is formed of a MOSFET, and is turned on and off in accordance with a PWM control signal from the motor control section 42. Further, the motor drive circuit 50 includes current sensors 53a, 53b, and 53c provided for the respective phases so as to detect currents flowing through the electric motor 15. Herein, these three current sensors 53a, 53b, and 53c will be collectively referred to as a "current sensor 53."

Next, the electric motor 15 and the motor control section 42, which drives and controls the electric motor 15, will be described in detail.

The electric motor 15 of the present embodiment is a brushless DC motor of a three-phase synchronous, permanent magnet type. This electric motor 15 includes a stator fixedly disposed in a housing. When three-phase currents (armature currents) are supplied to the coils CLu, CLv, and CLw wound on the stator, a three-phase rotating magnetic field is generated, whereby a rotor including a permanent magnet attached thereto rotates within the three-phase magnetic field in accordance with the three phase currents.

Figure 3:
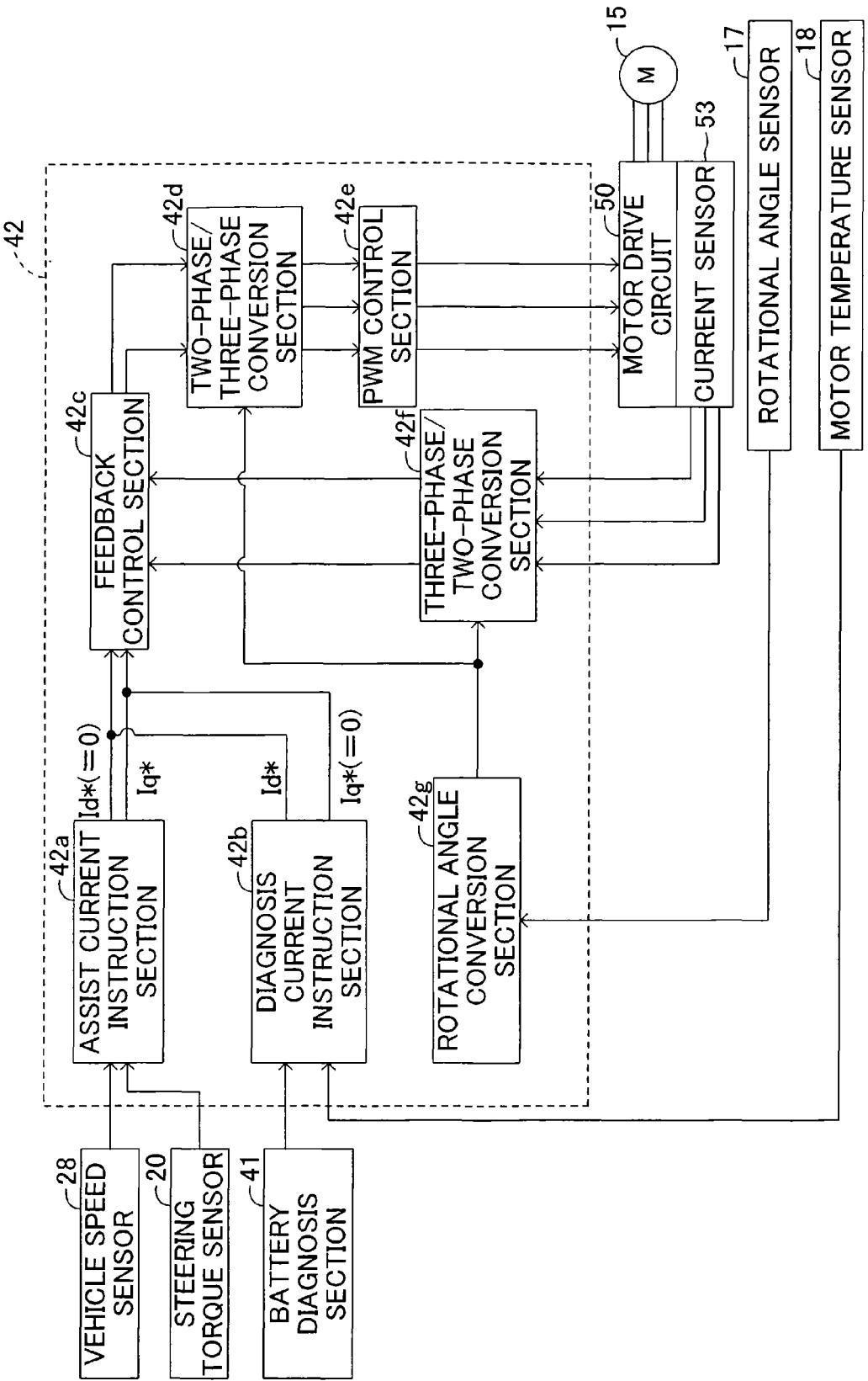
FIG. 3 is a functional block diagram showing the functions of a motor control section.

The motor control section 42 controls the three-phase currents flowing through the coils CLu, CLv, and CLw of the electric motor 15, and, as shown in FIG. 3, includes an assist current instruction section 42a, which calculates an assist current on the basis of vehicle speed v and steering torque TR inputted thereinto, and outputs an instruction to a feedback control section 42c.

This assist current instruction section 42a calculates two-phase instruction currents (Id*, Iq*) corresponding to an assist torque which increases with the steering torque TR and decreases with an increase in the vehicle speed v.

Figure 17:
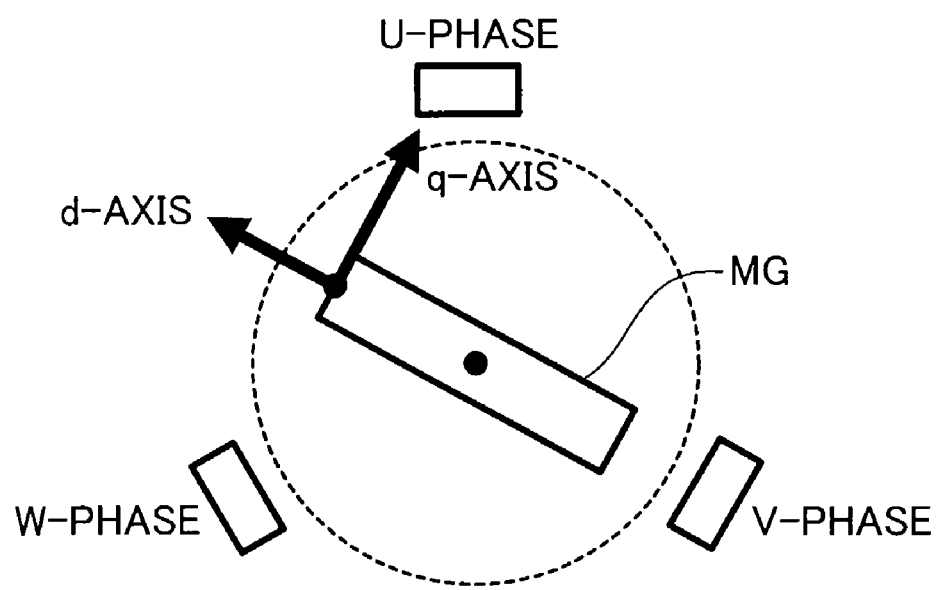
FIG. 17 is an explanatory diagram showing a d-q coordinate system.

As shown in FIG. 17, the two-phase instruction currents (Id*, Iq*) are armature currents in a d-q coordinate system consisting of a d axis which extends in the same direction as that of magnetic flux generated by a permanent magnet MG on the rotor of the electric motor 15, and a q axis perpendicular to the d axis. That is, the two-phase instruction currents (Id*, Iq*) are d-axis armature current on the d-axis in the d-q coordinate system and q-axis armature current on the q-axis in the d-q coordinate system, respectively.

The torque of the brush-less DC motor in the form of a three-phase synchronous, permanent magnet motor is proportional to the product of the armature-coil flux linkage and the q-axis armature current, and is not affected by the d-axis armature current in the d-q coordinate system. Accordingly, during assist control, an electricity supply instruction is output such that only the q-axis armature current Iq*, which generates rotational torque, flows, and the d-axis armature instruction current Id* is set to zero.

Further, the motor control section 42 includes a diagnosis current instruction section 42b which outputs an instruction for supplying electricity to the electric motor 15 at the time of battery condition diagnosis control to be described later. As will be described later, the battery condition diagnosis control is performed so as to supply a predetermined current to the electric motor 15 and diagnose the battery conditions on the basis of the battery voltage at that time. In order to prevent the electric motor 15 from rotating at that time, the diagnosis current instruction section 42b supplies two-phase instruction currents (Id*, Iq*) to the feedback control section 42c such that only the d-axis armature current, which generates no rotational torque, flows in the d-q coordinate system. Accordingly, in this case, the q-axis armature instruction current Iq* becomes zero.

When the d-axis armature current flows, magnetic flux of the opposite direction is applied to the permanent magnet provided on the rotor. Therefore, the d-axis armature current is excessively large, and the permanent magnet is demagnetized. In addition, the permanent magnet has properties such that it becomes more likely to be demagnetized at high temperature or at low temperature, depending on the type of the magnetic material. For example, a rare-earth magnet such as neodymium is likely to be demagnetized at high temperature, and a ferrite magnet is likely to be demagnetized at low temperature.

Figure 16A:
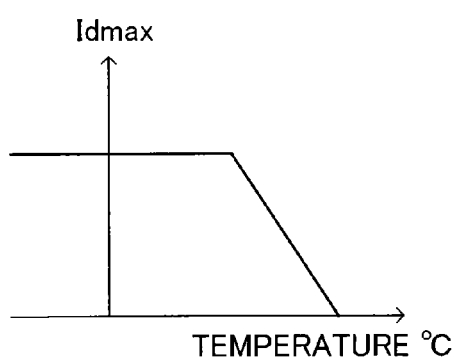
FIG. 16 is an explanatory diagram showing a map used for calculating d-axis armature current upper limit.
Figure 16B:
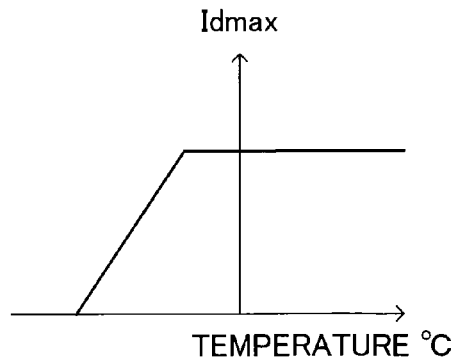

In view of the above, in the present embodiment, the diagnosis current instruction section 42b reads the detection signal from the motor temperature sensor 18, which detects the temperature of the electric motor 15, and sets the upper limit of the d-axis armature current in accordance with the detected temperature. For example, in a case where a rare-earth magnet, which is likely to be demagnetized at high temperature, is employed as the permanent magnet, a maximum (upper limit) d-axis armature current $Id_{max}$ is set in accordance with the detected temperature as shown in FIG. 16(A); and in a case where a ferrite magnet, which is likely to be demagnetized at low temperature, is employed, the maximum d-axis armature current $Id_{max}$ is set in accordance with the detected temperature as shown in FIG. 16(B).

The motor temperature sensor 18 may be configured to detect the temperature, of the housing of the electric motor 15 or its ambient temperature, or may be configured to estimate the temperature rather than directly detecting the temperature. For example, the motor temperature may be detected by use of an existing temperature sensor such as an outside-air temperature sensor for detecting the temperature of outside air, an intake-air temperature sensor for detecting the temperature of intake air of an engine, or a board temperature sensor for detecting the temperature of an unillustrated circuit board of the electronic control apparatus 40. Further, the motor temperature may be estimated through a process of acquiring the temperatures detected by means of the outside-air temperature sensor, the intake-air temperature sensor, and the board temperature sensor, and estimating the motor temperature from the combination of the detected temperatures.

The instruction signals from the assist current instruction section 42a and the diagnosis current instruction section 42b are fed to the feedback control section 42c. This feedback control section 42c is also fed with detection values of two-phase currents Id and Iq, which are two-phase currents converted from detection values of three-phase currents Iu, Iv, and Iw flowing through the coils CLu, CLv, and CLw of the electric motor 15. The three-phase currents Iu, Iv, and Iw flowing through the electric motor 15 are detected by means of the current sensor 53, and converted to the two-phase currents Id and Iq by means of a three-phase/two-phase conversion section 42f.

For such three-phase/two-phase conversion, a rotational angle conversion section 42g for converting the motor rotational angle detected by the rotational angle sensor 17 to electrical angle is connected to the three-phase/two-phase conversion section 42f.

The feedback control section 42c calculates difference signals Id*-Id and Iq*-Iq, which represent the differences between the two-phase instruction currents Id* and Iq* and the two-phase detection currents Id and Iq, so as to feedback-control the three-phase currents Iu, Iv, and Iw flowing through the coils CLu, CLv, and CLw of the electric motor 15.

The two-phase current differential signals Id*-Id and Iq*-Iq are fed to a PWM control section 42e after being converted to three-phase signals by means of a two-phase/three-phase conversion section 42d. Notably, for this two-phase/three-phase conversion, an electrical angle signal output from the rotational angle conversion section 42g is supplied to the two-phase/three-phase conversion section 42d.

The PWM control section 42e generates pulse width modulation (PWM) control signals corresponding to the difference signals Id*-Id and Iq*-Iq on the basis of the three-phase signals from the two-phase/three-phase conversion section 42d, and outputs them to the motor drive circuit 50.

Notably, in the present embodiment, the motor control section 42 configured as described above is realized through execution of a program by a microcomputer, and FIG. 3 shows the functions of the respective sections in the form of a block diagram.

The d-axis electrification control means of the present invention is constituted by the diagnosis current instruction section 42b, the feedback control section 42c, the two-phase/three-phase conversion section 42d, the PWM control section 42e, the three-phase/two-phase conversion section 42f, and the rotational angle conversion section 42g.

Next, the structure of a power supply line of the battery 60 will be described with reference to FIG. 2.

The battery 60 used in the present embodiment has a rated voltage of 12 V.

An alternator 70, serving as a generator, is connected to a power supply base line 62 connected to a power supply terminal (+terminal) 61 of the battery 60. Further, the electric power steering apparatus 1 and other electrical control systems ES are connected to the power supply base line 62 via an ignition switch 80.

A power supply line to the electric power steering apparatus 1 is composed of a control power supply line 63 connected to the secondary side (load side) of the ignition switch 80, and a drive power supply line 64 connected to the primary side (power source side) of the ignition switch 80.

A power relay 65 is disposed in the drive power supply line 64, and a connection line 66 connected to the control power supply line 63 is provided on the load side of the power relay 65. A diode 67, serving as a reverse-flow prevention element, is provided in the connection line 66 so as to prevent current from flowing from the control power supply line 63 to the drive power supply line 64.

A diode 68, serving as a reverse-flow prevention element, is provided in the control power supply line 63 on the power source side with respect to the connection point between the control power supply line 63 and the connection line 66 so as to prevent flow of current toward the power source side.

The control power supply line 63 is used for supply of power to the electronic control apparatus 40, and the drive power supply line 64 is used for supply of power to the motor drive circuit 50.

The power relay 65 provided in the drive power supply line 64 is opened and closed by means of a signal from the electronic control apparatus 40. The power relay 65 is turned on (closed) after the ignition switch 80 is turned on, and is turned off (opened) after the ignition switch 80 is turned off and a battery-condition diagnosis control routine to be described later is completed. Further, the voltage of the drive power supply line 64 is monitored, as battery detection voltage, by the battery diagnosis section 41.

Next, the battery-condition diagnosis control performed by the electronic control apparatus 40 will be described.

FIGS. 4 to 7 show the battery-condition diagnosis control routine executed by the electronic control apparatus 40, and stored in ROM of the electronic control-apparatus 40 as a control program.

Figure 4:
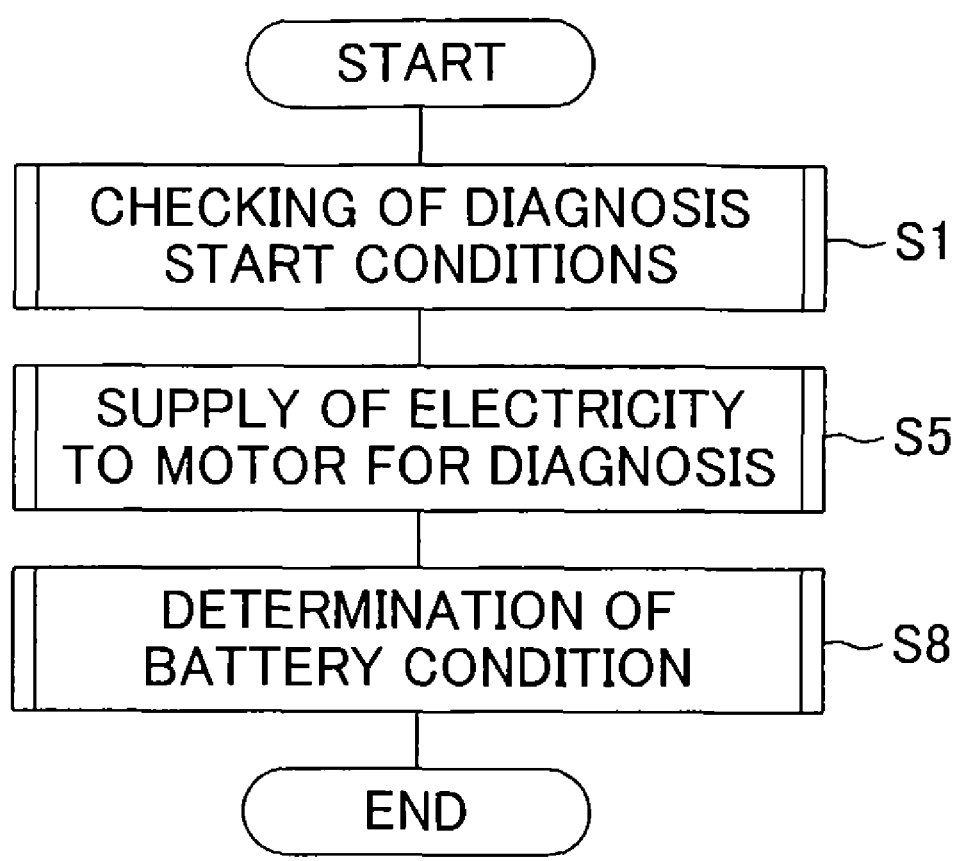
FIG. 4 is a flowchart showing the entirety of a battery condition diagnosis control routine.

As shown in FIG. 4, the battery-condition diagnosis control routine is mainly composed of a diagnosis start condition check routine (S1) for checking whether or not diagnosis start conditions are satisfied; a diagnosis-time motor electrifying routine (S5) for actually supplying electricity to the electric motor 15 and detecting the level of a drop in the battery voltage; and a battery condition determination routine (S8) for determining the condition of the battery 60 on the basis of the battery voltage drop level.

First, the diagnosis start condition check routine will be described with reference to FIG. 5.

Figure 5:
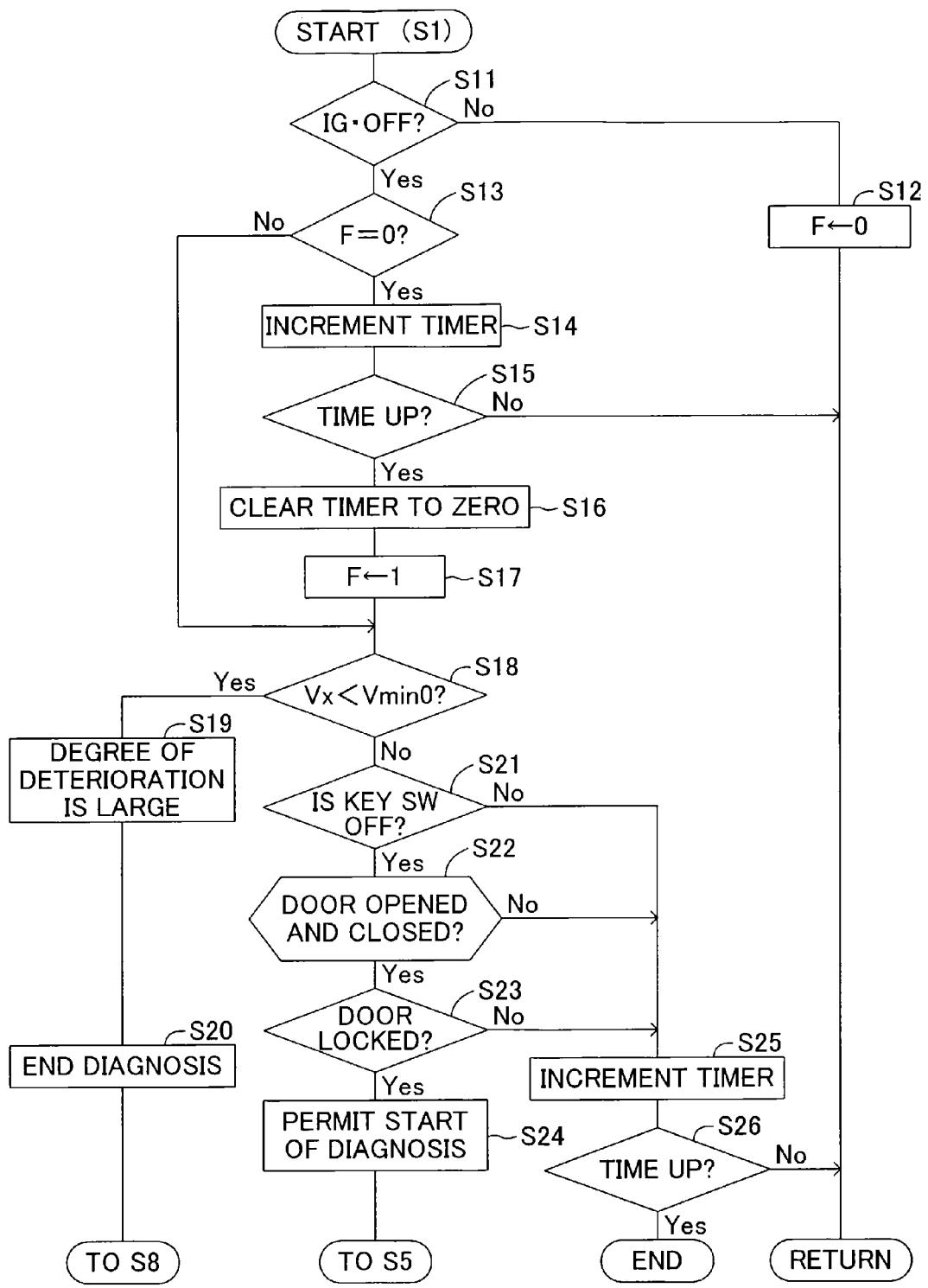
FIG. 5 is a flowchart showing a diagnosis start condition check routine.

FIG. 5 shows the diagnosis start condition check routine, which is executed by the electronic control apparatus 40 at predetermined short intervals. When the diagnosis start conditions are satisfied, the electronic control apparatus 40 exits the present routine and moves to the diagnosis-time motor electrifying routine of step S5. When a battery deterioration is determined in the middle of the routing of step S5 and the diagnosis is decided to be ended, the electronic control apparatus 40 exits the present routine, and moves to the battery condition determination routine of step S8.

When the present routine is started, the electronic control apparatus 40 first determines whether or not the ignition switch 80 is turned off (S11). This determination is continued until the ignition switch 80 is turned off. When an operation of turning the ignition switch 80 off is detected (S11: Yes), the electronic control apparatus 40 determines whether or not a flag F is "0" (S13). This flag F is set to "0" when the present routine is started, and is set to "1" when a predetermined time elapses after the ignition switch 80 is turned off, as will be described later.

Accordingly, immediately after the ignition switch 80 is turned off, the electronic control apparatus 40 makes a "Yes" determination in step S13, and increments a timer for time measurement (S14). This timer measures a time elapsed after the ignition switch 80 is turned off, and is started when step S14 is performed for the first time.

Subsequently, the electronic control apparatus 40 determines whether or not the time measured by the timer reaches a predetermined time (S15), and repeats this processing until the measured time reaches the predetermined time.

When the predetermined time has elapsed, the electronic control apparatus 40 makes a "Yes" determination in step S15. In this case, the electronic control apparatus 40 clears the timer to zero (S16), and sets the flag F to "1" (S17).

Figure 8:
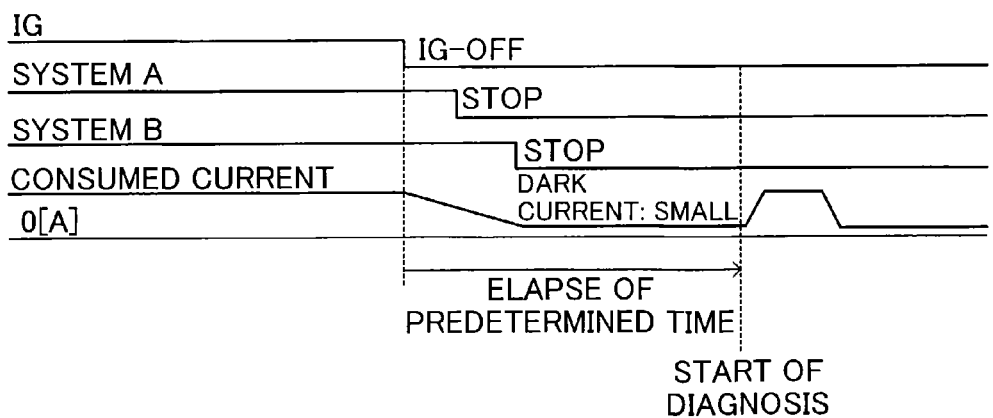
FIG. 8 is a timing chart showing conditions after an ignition switch is turned off.

When the predetermined time has elapsed after the ignition switch 80 is turned off as described above, as shown in FIG. 8, operations of the individual electrical control systems ES stop, and the current flowing out of the battery 60 becomes very small (corresponding to dark current). That is, the predetermined time measured by means of the timer is set to correspond to a time required by the individual electrical control systems ES to stop.

Subsequently, the electronic control apparatus 40 proceeds to step S18, reads a battery detection voltage Vx, and compares the battery detection voltage Vx with a lowest reference voltage Vmin0 (in the present embodiment, Vmin0=11 V) (S18). When Vx<Vmin0 (S18: Yes), the electronic control apparatus 40 determines that the battery 60 has deteriorated (S19), without performing diagnosis of the battery 60, which will be described later. In this case, the electronic control apparatus 40 issues a diagnosis end signal (S20), and moves to the battery condition determination routine of step S8.

Meanwhile, when in step S18 the battery detection voltage Vx is determined to be equal to or higher than the lowest reference voltage Vmin0, the electronic control apparatus 40 further checks the following three diagnosis start conditions.

That is, the electronic control apparatus 40 determines whether or not the following three diagnosis start conditions are satisfied: the ignition key has been removed (S21); a door of the vehicle has been opened and closed (S22); and the door has been locked (S23). The electronic control apparatus 40 makes the determination in step S21 by reading a signal from the key switch 83, which is turned on and off upon insertion and removal of the ignition key. The electronic control apparatus 40 makes the determination in step S22 by reading a signal from the door switch 81, which is turned on and off when the door is opened and closed. The electronic control apparatus 40 makes the determination in step S23 by reading a signal from the door lock switch 82, which is turned on and off when the door is locked and unlocked.

When the three conditions are satisfied, the electronic control apparatus 40 estimates that the driver has exited the vehicle, determines that start of diagnosis of battery conditions is permitted (S24), and proceeds to the diagnosis-time motor electrifying routine of step S5.

Meanwhile, when any of the three conditions is not satisfied, the electronic control apparatus 40 does not start the processing of the diagnosis-time motor electrifying routine, and repeatedly executes the above-described processing. When the ignition switch 80 is turned on (S11: No) during the repeated processing, the electronic control apparatus 40 resets the flag F to "0" (S12). In this manner, when the ignition switch 80 is turned off again, the above-described processing is performed again from the beginning.

Further, the electronic control apparatus 40 measures a time during which any of the three conditions of steps S21, S22, and S23 is not satisfied (S25), and when this time reaches a predetermined time (S26: Yes), the electronic control apparatus 40 ends the present control routine.

Notably, the above-described steps S18 and S24 correspond to the pre-electrification-voltage detection means and the electrification diagnosis permission means of the present invention.

Figure 6:
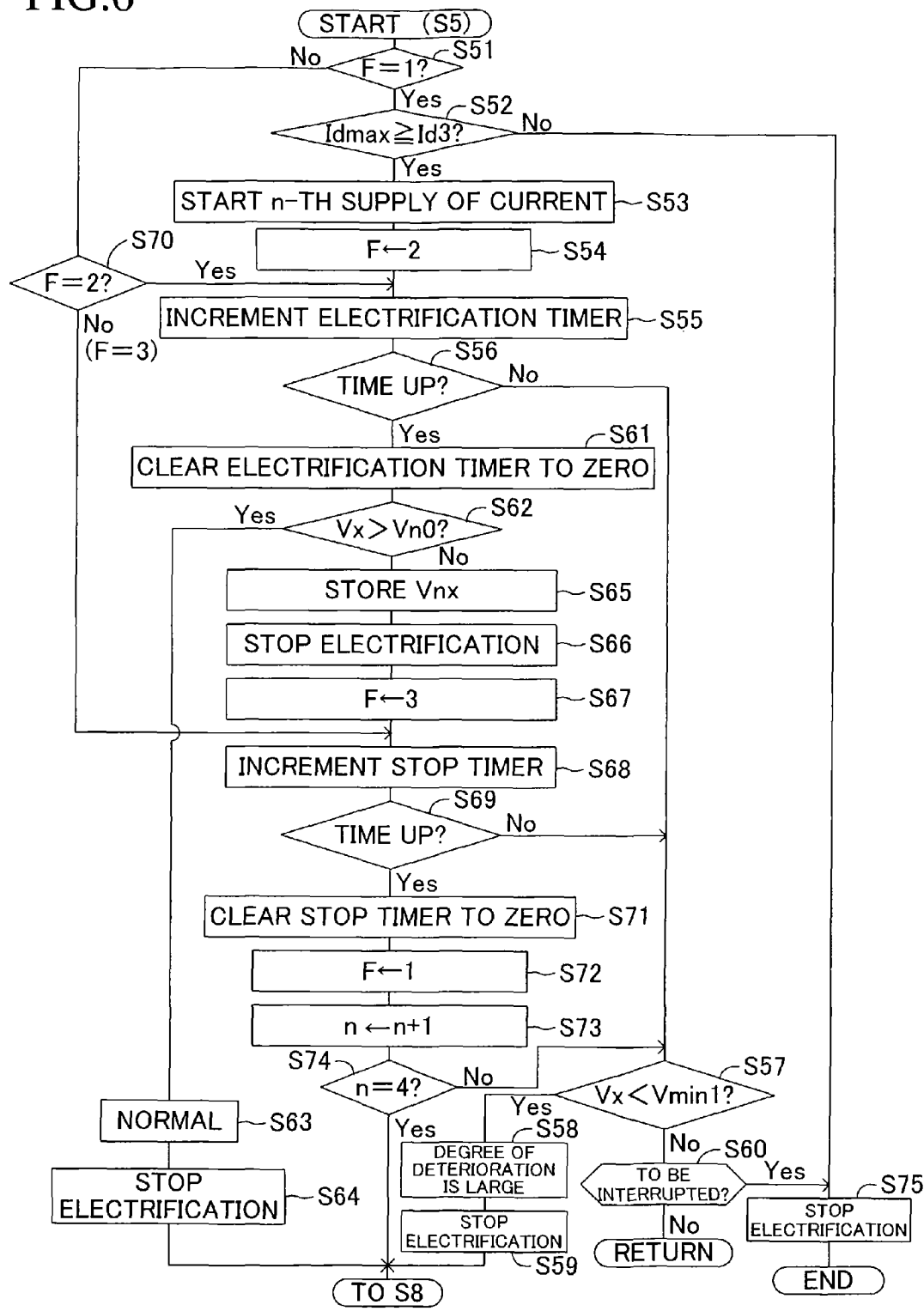
FIG. 6 is a flowchart showing a diagnosis-time electrifying routine.

Next, the diagnosis-time motor electrifying routine of step S5 will be described FIG. 6 shows the diagnosis-time motor electrifying routine, which is executed by the electronic control apparatus 40 at predetermined intervals.

First, the electronic control apparatus 40 determines whether or not the flag F is "1" (S51). Since the flag F has been set to "1" in the above-described step S17, the electronic control apparatus 40 inevitably makes a "Yes" determination. Notably, the flag F is set to "1" before start of supply of electricity to the electric motor 15, to "2" during the supply of electricity, and to "3" after stoppage of the supply of electricity.

Subsequently, the electronic control apparatus 40 determines whether or not the maximum d-axis armature current $Id_{max}$ that can be supplied to the electric motor 15 is at least a set current Id3 to be described later (d-axis armature current obtained through three-phase to two-phase conversion of a third-time supply current I3 shown in FIG. 9) (S52). The maximum d-axis armature current $Id_{max}$ is calculated from the temperature detected by means of the motor temperature sensor 18 or with reference to a map shown in FIG. 16(A) or 16(B). When $Id_{max} \geqq Id3$, the electronic control apparatus 40 starts electricity supply processing, starting from step S53.

Meanwhile, when $Id_{max} < Id3$, the electronic control apparatus 40 ends the motor electrifying control for battery diagnosis, in order to avoid demagnetization of the permanent magnet of the electric motor 15.

When the determination in step S52 is "Yes"; i.e., when the maximum d-axis armature current $Id_{max}$ is at least the set current Id3, the electronic control apparatus 40 proceeds to step S53 so as to start the first-time supply of electricity to the electric motor 15. Notably, "n" in step S53 is set to "1" at the time of start of diagnosis.

Figure 9:
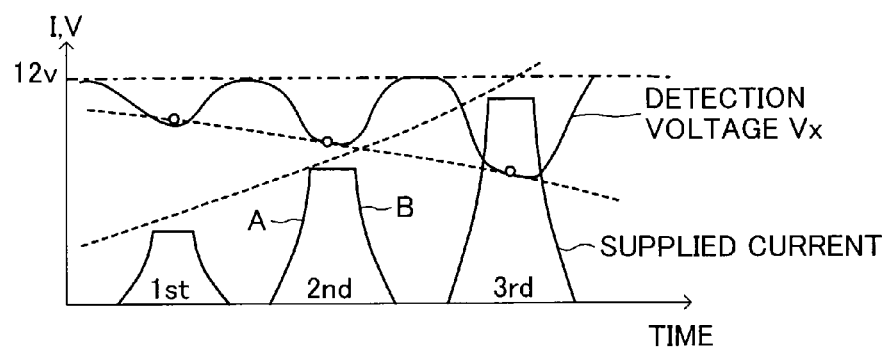
FIG. 9 is a graph showing changes in supplied current and battery voltage.

In the present embodiment, as shown in FIG. 9, supply of electricity is performed three times, in a divided manner. In this case, the current supplied to the electric motor 15 is adjusted to a predetermined level by means of the PWM control section 42e, which adjusts the pulse widths of the switching elements SW11, SW12, SW21, SW22, SW31, and SW32 of the motor drive circuit 50 on the basis of the difference signals Id*-Id and Iq*-Iq, which represent the differences between the two-phase instruction currents Id* and Iq* from the diagnosis current instruction section 42b and the two-phase detection currents Id and Iq, which are obtained through three-phase to two-phase conversion of the three-phase currents detected by means of the current sensor 53.

In this case, in order to prevent the electric motor 15 from rotating upon supply of electricity, the motor control section 42 controls the motor drive circuit 50 such that only the d-axis armature current in the d-q coordinate system flows, and no q-axis armature current flows.

Accordingly, the electric motor 15 does not rotate when electricity is supplied to the electric motor 15 for battery diagnosis, and therefore, the steering wheel 11 does not rotate, whereby safety can be secured even when a person sits in the driver's seat.

Further, each time electricity is supplied, the current is controlled to gradually increase at the start of electricity supply, and to gradually decrease at the end of electricity supply.

Notably, if the electric motor 15 rotates irrespective of the control performed such that only the d-axis armature current flows, it is desired to stop the supply of electricity at that time, and to end the diagnosis of the battery conditions.

After start of the first-time supply of electricity to the electric motor 15 in step S53, the electronic control apparatus 40 sets the flag F to "2" (S54).

The electronic control apparatus 40 then increments an electrification timer for measuring an electrification time (S55), and determines whether or not the electrification time measured by means of the electrification timer has reached a predetermined time (S56). The supply of electricity to the electric motor 15 is continued until the predetermined time elapses. During this period, the electronic control apparatus 40 determinations whether or not the battery detection voltage Vx has become lower than a preset, predetermined voltage Vmin1 (in the present embodiment, Vmin1=9 V) (S57). When the battery detection voltage Vx has become lower than the voltage Vmin1, the electronic control apparatus 40 determines that the battery 60 is in a deteriorated condition, and continuing the diagnosis through supply of electricity is not preferable, because this may deteriorate the battery 60 further. Thus, the electronic control apparatus 40 stops the supply of electricity (S58 and S59), and moves to the processing of step S8.

Meanwhile, when in step S57 the battery detection voltage Vx is determined to be equal to or higher than the predetermined voltage Vmin1, the electronic control apparatus 40 further determines whether or not a battery diagnosis interruption condition is detected (S60). If the battery diagnosis interruption condition is detected, the electronic control apparatus 40 stops the supply of electricity (S75), and ends the present control routine. That is, the present control routine is ended if the ignition switch 80 is turned on, the key switch is inserted, the door is opened and closed, or the door is unlocked during execution of the present control routine.

When the interruption condition is not detected, the electronic control apparatus 40 returns to step S51 of the present control routine. In this case, since the flag F has been set to "2," the electronic control apparatus 40 proceeds from step S51 to step S55 so as to increment the electrification timer, and then repeats the same processing until the supply of electricity over the predetermined time ends.

When the electrification timer indicates that the predetermined time has elapsed from the start of electrification (S56: Yes), the electronic control apparatus 40 clears the electrification timer to zero (S61), and determines whether or not the battery detection voltage Vx is higher than a normal reference voltage Vn0 (S62).

In the present control routine, electricity is supplied to the electric motor 15 three times, in a divided manner, as will be understood from the processing to be described later. Therefore, this normal reference voltage Vn0 is previously set in accordance with the number (n) of times of electrification; i.e., for each of the first-time, second-time, and third-time electrifications, on the basis of the voltage drop characteristic of the battery 60 in a good condition.

When the electronic control apparatus 40 determines in step S61 that the battery detection voltage Vx is higher than the normal reference voltage Vn0, the electronic control apparatus 40 determines at this point in time that the battery 60 is in a good condition, stops the supply of electricity (S63, S64), and proceeds to the routine of step S8.

When the electronic control apparatus 40 determines in step S62 that the battery detection voltage Vx is equal to or lower than the normal reference voltage Vn0, the electronic control apparatus 40 stores the battery detection voltage Vx in a nonvolatile memory within the electronic control apparatus 40 (S65), and stops the supply of electricity (S66).

Subsequently, the electronic control apparatus 40 sets the flag F to "3" (S67), and increments a stop timer (S68). This stop timer measures a time elapsed after the supply of electricity is ended. The flag F is maintained at "3" during this period. The determinations in the above-described steps S57 and S60 are repeated until the time measured by the stop timer reaches a predetermined time.

When the stop timer indicates that the predetermined time has elapsed, the electronic control apparatus 40 clears the stop timer to zero (S71), sets the flag F to "1" (S72), and increments a counter value n by one (S73). This counter value n represents the number of times of electrification, and its initial value is 1. Accordingly, the counter value n is changed to 2 after the first-time electrification.

The electronic control apparatus 40 then determines in step S74 whether or not the counter value n is 4, and repeats the above-described processing until the counter value n becomes 4. That is, as shown in FIG. 9, the predetermined current (only the d-axis armature current) is supplied to the electric motor 15 three times, in a divided manner, and the battery detection voltage Vnx during each current supply operation is stored.

In this case, the supply of electricity in step S53 is performed in such a manner that the current increases with the counter value n (I1<I2<I3), for the following reasons. If a large current is supplied abruptly from the first-time electrification, depending on the condition of the battery 60, the battery voltage may drop sharply, with a resultant failure of a full-time electricity supply system of the vehicle.

Further, the power consumption of the battery 60 can be suppressed by means of divided electrification over a plurality of times. In this case, the time of electrification in each time is desirably equal to or less than 1 second.

During each electrification period, the supply current is gradually increased at the start of electrification (see portion A of FIG. 9) and gradually decreased at the end of electrification (see portion B of FIG. 9), for the sake of safety. That is, even if the electric motor 15 generates a rotational torque, its rotation does not occur abruptly, whereby safety is secured.

When determination as to the battery conditions is completed in the middle of the above-described diagnosis processing; i.e., when the battery is completely normal, or the battery has deteriorated considerably, the supply of electricity is stopped upon completion of such determination. Therefore, the power of the battery 60 is not consumed excessively.

With the above-described processing, upon completion of the third-time electrification, the electronic control apparatus 40 proceeds to the battery condition determination routine of step S8.

Here, the processing of step S52 will be described supplementally.

The diagnosis-time motor electrification control is performed such that only the d-axis armature current in the d-q coordinate system of the electric motor 15 flows. However, if the d-axis armature current is excessively large, the permanent magnet provided on the rotor may be demagnetized. In addition, the permanent magnet has properties such that it becomes likely to be demagnetized at high temperature or at low temperature, depending on the type of the magnetic material thereof. In view of this, the maximum d-axis armature current $Id_{max}$ is set in the diagnosis current instruction section 42b in accordance with the detected motor temperature.

During the above-described motor electrification control for battery diagnosis, the maximum d-axis armature current $Id_{max}$ set in accordance with the motor temperature may decrease, and become smaller than the d-axis armature current Id3, which is obtained through three-phase to two-phase conversion of a current I3 previously set for the third-time electrification. In this case (S52: No), the permanent magnet may be demagnetized as a result of electrification for battery diagnosis. Therefore, the electronic control apparatus 40 proceeds to step S75, stops the supply of electricity if the electricity supply is currently being performed, and ends the motor electrification control for battery diagnosis.

As a result, demagnetization of the permanent magnet of the electric motor 15 during diagnosis of battery conditions can be prevented without fail.

Figure 7:
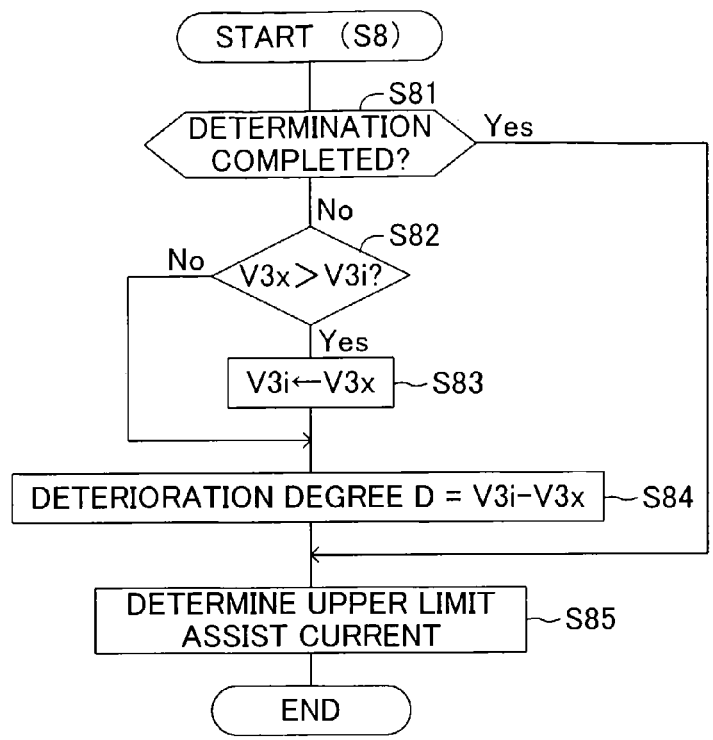
FIG. 7 is a flowchart showing a battery condition determination routine.

Next, the battery condition determination routine executed by the electronic control apparatus 40 will be described with reference to FIG. 7.

When the present routine is started, the electronic control apparatus 40 first determines whether or not the determination as to battery conditions has been completed (S81). That is, when in the above-described step S63 the battery 60 has been determined to be in a good condition or when in the above-described step S19 or S58 the battery 60 has been determined to be in a deteriorated condition, the electronic control apparatus 40 determines that the determination as to battery conditions has been completed. In other cases, the electronic control apparatus 40 determines that the determination as to battery conditions has not yet been completed.

When the determination as to battery conditions has not yet been completed, the electronic control apparatus 40 proceeds to step S82. In this step, the electronic control apparatus 40 determines whether or not the battery detection voltage V3x (battery detection voltage at the time of the third-time electrification) stored in the above-described step S65 is higher than the maximum value V3$i$ of the battery detection voltages V3$x$ obtained in the past. When the battery detection voltage V3$x$ obtained this time is higher than the maximum value V3$i$ of the battery detection voltages V3$x$ obtained in the past, the battery detection voltage V3$x$ obtained this time is stored as the maximum value V3$i$ of the battery detection voltages V3$x$ obtained in the past, whereby the maximum value V3$i$ is updated (S83). That is, the battery voltage characteristic of the battery 60 in an initial condition is stored. In the following description, the maximum value V3$i$ will be called "initial battery voltage V3$i$."

Notably, the battery detection voltage V3$x$ and the initial battery voltage V3$i$ correspond to battery voltage change data of the present invention.

Subsequently, in step S84, the electronic control apparatus 40 determines the deterioration degree D of the battery 60. In the present embodiment, the deterioration degree D is a value obtained by subtracting the battery detection voltage V3$x$ detected at the present time from the initial battery voltage V3$i$ (D=V3$i$−V3$x$).

Notably, in the present specification, the case where the battery 60 has deteriorated and the case where the charging rate of the battery 60 has been lowered are not distinguished from each other. When the battery 60 stores a reduced amount of electrical power, the battery 60 is considered to have deteriorated, and the smaller the amount of electrical power stored, the higher the deterioration degree D to which the battery 60 is considered to have deteriorated.

Figure 10:
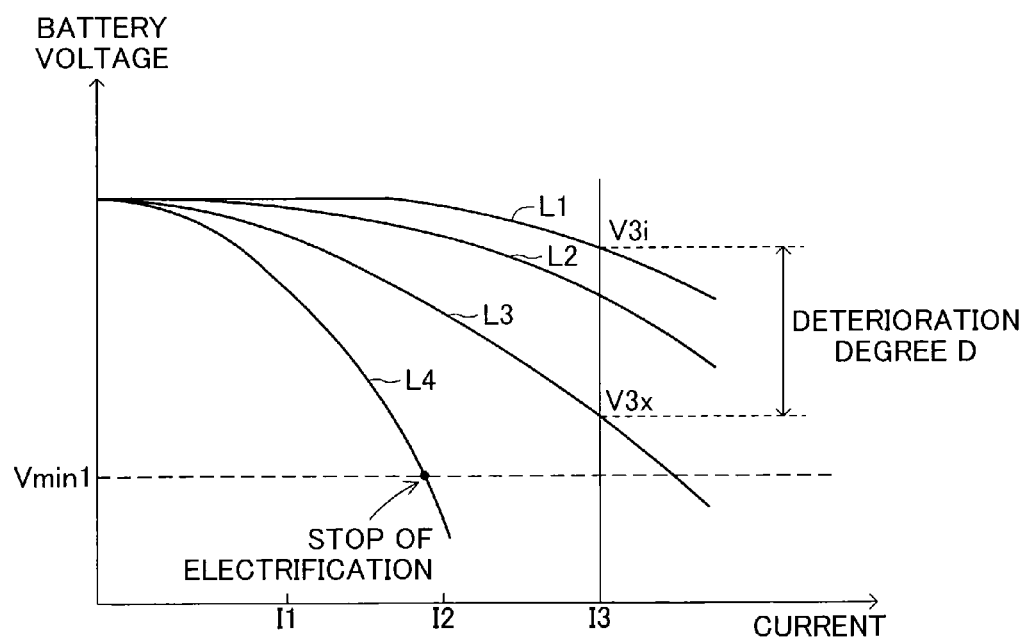
FIG. 10 is a graph showing change in battery voltage with an increase in supplied current.

FIG. 10 shows change in voltage with the deterioration degree D of the battery 60.

In this example, a curve L1 represents a voltage change characteristic of the battery 60 in an initial condition. The greater the deterioration degree D, the greater the amount by which the voltage drops with an increase in supplied current (the larger the number suffixed to the letter "L" in the graph, the greater the deterioration degree D).

Accordingly, the deteriorated condition of the battery 60 can be accurately determined through comparison between the battery detection voltage V3$x$ at the time of the third-time electrification, in which the largest current is supplied, and the initial battery voltage V3$i$.

Notably, in the example shown in FIG. 10, when the battery has a voltage change characteristic represented by a curve L4, the battery detection voltage V2$x$ at the time of the second-time electrification becomes lower than the predetermined voltage Vmin1 (9V). In this case, in the above-described step S58, the degree of deterioration is determined to be large, the diagnosis is ended at this point in time, and the battery detection voltage V3$x$ is not measured. However, in such a case, the deterioration degree D is set to the maximum value.

Further, in the case where the battery conditions are determined to be good in the above-described step S62, the deterioration degree D is set to the minimum value.

Figure 11:
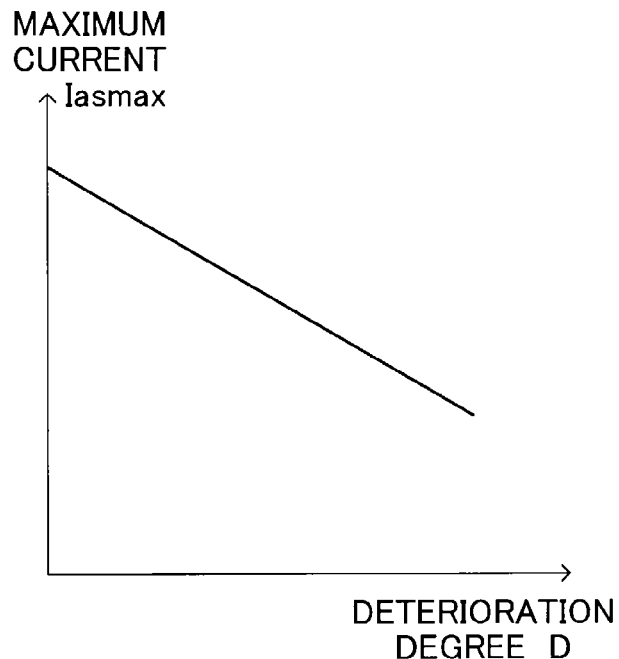
FIG. 11 is an explanatory diagram showing a map used for calculating maximum (upper limit) assist current.

Once the deterioration degree D of the battery is calculated in this manner, the electronic control apparatus 40 determines a maximum (upper limit) assist current $I_{asmax}$ on the basis of the deterioration degree D (S85). As shown in a reference map of FIG. 11, the greater the deterioration degree D, the smaller the value to which the maximum assist current $I_{asmax}$ is set. The reference map is previously stored in the ROM of the electronic control apparatus 40.

Figure 12:
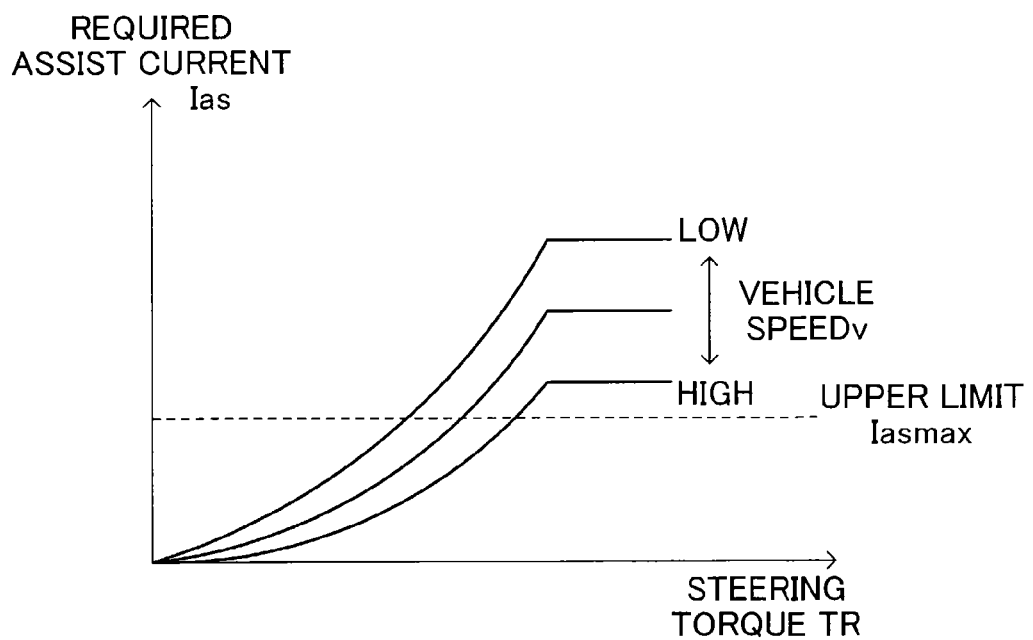
FIG. 12 is an explanatory diagram showing a map used for calculating required assist current.

Assist current refers to current which is supplied to the electric motor 15 so as to generate a predetermined steering torque, and is determined from the steering torque TR and the vehicle speed v in the present embodiment, as shown in FIG. 12.

After the maximum assist current $I_{asmax}$ is determined in the above-described manner, the present battery condition determination routine is ended.

The results of the battery condition diagnosis obtained through this control routine are reflected in the maximum assist current $I_{asmax}$, and preferably reported to the driver by means of the reporting unit 29 when the driver resumes operation of the vehicle. In this case, the driver can see the results of the battery condition diagnosis, and change the battery at a proper timing. Therefore, the steering assist function of the electric power steering apparatus 1 can be attained sufficiently, and the various electronic control systems ES operate well at all times. Further, abrupt failure of the electronic control systems can be prevented. Further, it is possible to prevent useless exchange of a battery which has not yet deteriorated.

Notably, for the battery condition diagnosis, the current taken out of the battery 60 must be detected accurately. In the present embodiment, the current taken out of the battery 60 is estimated on the basis of the current detected by means of the current sensor 53 of the motor drive circuit 50.

For example, the current taken out of the battery 60 can be estimated by adding the current detected by means of the current sensor 53, the current (known) used in the electronic control apparatus 40, and the dark current (known) used in other electrical control systems ES.

Next, assist control processing performed by the motor control section 42 of the electronic control apparatus 40 will be described.

Figure 13:
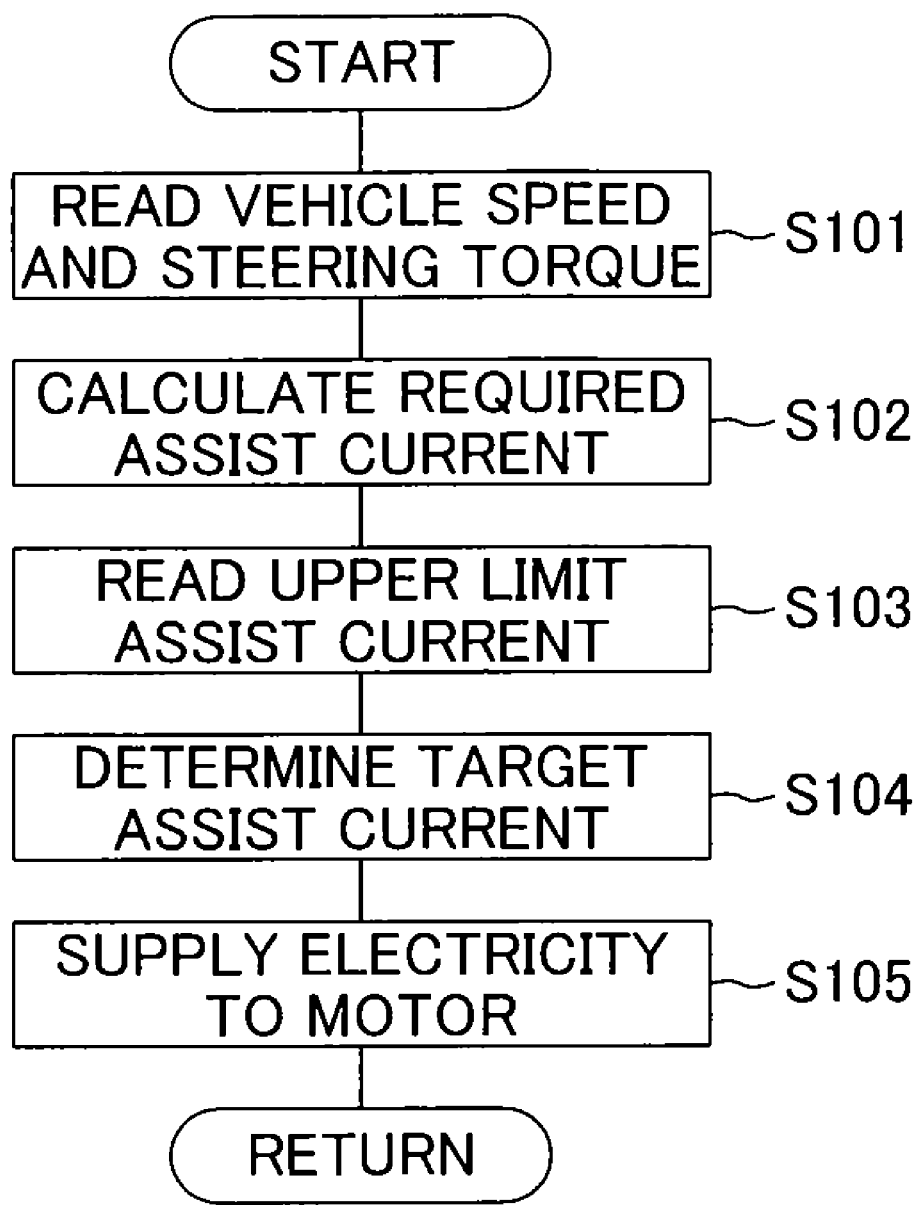
FIG. 13 is a flowchart showing an assist control routine.

FIG. 13 shows an assist control routine executed by the motor control section 42. This routine is stored in the ROM of the electronic control apparatus 40 as a control program, and is repeatedly executed at short intervals.

When the present control routine is started in response to turning on of the ignition switch 80, in step S101, the electronic control apparatus 40 first reads the vehicle speed v detected by means of the vehicle speed sensor 28, and the steering torque TR, which is calculated from the difference between rotational angles detected by means of the resolvers 22 and 23 of the steering torque sensor 20.

Subsequently, the electronic control apparatus 40 calculates a required assist current $I_{as}$ corresponding to the vehicle speed v and the steering torque TR, by reference to an assist current map shown in FIG. 12 (S102). The assist current map is stored in the ROM of the electronic control apparatus 40, and is set such that the required assist current $I_{as}$ increases with the steering torque TR and assumes a lager value as the vehicle speed v decreases, as shown in FIG. 12.

Next, the electronic control apparatus 40 reads the maximum assist current $I_{asmax}$ determined by means of the above-described battery condition diagnosis control routine (S103).

Subsequently, the electronic control apparatus 40 selects, as a target assist current to be supplied to the electric motor 15, the smaller one of the required assist current $I_{as}$ calculated in step S102 and the maximum assist current $I_{asmax}$ read in step S103 (S104). Accordingly, when the required assist current $I_{as}$ is smaller than the maximum assist current $I_{asmax}$, the required assist current $I_{as}$ is used as the target assist current; and when the required assist current $I_{as}$ is larger than the maximum assist current $I_{asmax}$, the maximum assist current $I_{asmax}$ is used as the target assist current.

In this case, two-phase instruction currents Id* and Iq* corresponding to the target assist current $I_{as}$ are calculated in the assist current instruction section 42$a$. However, the two-phase instruction currents Id* and Iq* are calculated such that only the q-axis armature current in the d-q coordinate system flows, and no d-axis armature current flows.

Subsequently, the electronic control apparatus 40 supplies electricity to the electric motor 15 such that the current flowing through the electric motor 15 becomes equal to the determined target assist current, and thus, a predetermined assist torque is generated (S105).

Through repeated execution of the above-described processing, a proper assist current corresponding to the battery conditions can be supplied to the electric motor 15.

The assist control routine is started when the ignition switch 80 is turned on. However, in the case where the period between the immediately previous turning off of the ignition switch 80 and the present turning on of the ignition switch 80 is longer than a predetermined period (e.g., six months), the battery conditions are likely to have changed greatly. In such a case, the electronic control apparatus 40 invalidates the above-described results (degradation degree D) of the previous battery diagnosis, and ignores the maximum assist current $I_{asmax}$ set in accordance with the degradation degree D. That is, the electronic control apparatus 40 does not restrict the assist current by the maximum assist current $I_{asmax}$. Alternatively, the maximum assist current $I_{asmax}$ may be corrected.

The electric power steering apparatus 1 equipped with the battery condition diagnosis apparatus of the present embodiment, which has been described above, provides the following advantageous effects.

1. Electricity is supplied to the electric motor 15 of the electric power steering apparatus 1 so as to diagnose battery conditions, after the supply of power to the various electronic control systems ES is stopped by mean of turning off the ignition switch 80. Therefore, the battery diagnosis is not adversely affected by operations of other electronic control systems ES or generation of electricity by the alternator 70. In addition, since a sufficiently long time can be used for the diagnosis, accurate diagnosis results can be obtained.

2. At the time of battery diagnosis, a predetermined current can be supplied to the electric motor 15 by making use of the current sensor 53 provided in the motor drive circuit 50. Therefore, no special current sensor is required to be provided for battery diagnosis, whereby cost can be lowered.

3. Since battery diagnosis is performed by use of the electric power steering apparatus 1, which consumes large current, a large current can be taken out of the battery 60 at the time of the battery diagnosis, so that the diagnostic accuracy of the battery conditions becomes higher.

4. During the battery diagnosis, only the d-axis armature current in the d-q coordinate system of the electric motor 15 flows, and no q-axis armature current flows. Therefore, no rotational torque is generated, and the steering wheel 11 does not rotate. Accordingly, the battery conditions can be diagnosed, while safety is secured for the driver.

In addition, a complicated structure for driving a plurality of electric motors in opposite directions as in the conventional apparatus is not required, and the condition of the battery can be diagnosed by means of a simple structure, without changing the condition of the vehicle. Therefore, the present apparatus has a very high degree of general versatility.

5. An upper limit corresponding to the motor temperature is set for the d-axis armature current, and the d-axis armature current is controlled so as not to exceed the upper limit. Therefore, demagnetization of the permanent magnet of the rotor can be prevented without fail.

6. At the time of battery diagnosis, the current supplied to the electric motor 15 is increased gradually. Therefore, problems, such as abrupt drop in the battery voltage causing failure of the full-time electricity supply system of the vehicle, can be prevented. Further, even if the electric motor 15 generates a rotational torque, the power steering apparatus does not operate abruptly, so that safety can be secured.

7. Through intermittent supply of electricity to the electric motor 15, the power consumption of the battery 60 can be suppressed. Further, since the current supplied to the electric motor 15 is increased with the number of times of electrification, abrupt supply of electricity to the electric motor 15 can be avoided, and the battery voltage does not drop sharply. Further, when the battery diagnosis is completed before the number of times of electrification reaches a predetermined number, the supply of electricity is stopped at that time, whereby the power consumption of the battery 60 can be reduced further.

8. Determination as to battery deterioration is performed through comparison between the voltage of an actual battery in an initial condition (detection voltage $V3i$) and the voltage at the time of diagnosis (detection voltage $V3x$). In addition, when the detection voltage $V3x$ is higher than the past measured values, that value is stored as the voltage $V3i$ in the initial condition, whereby the voltage $V3i$ is updated. Therefore, the diagnosis is not affected by variation in voltage characteristic caused by the individual deviation of the battery 60, and the diagnosis in relation to the initial condition can be always performed, whereby accurate diagnosis results are obtained.

9. Since the upper limit of the assist current is determined in accordance with the battery deterioration degree D, excessive restriction on the amount of electricity supplied to the electric motor 15 is prevented, and proper steering assist torque can be obtained. Further, the maximum (upper limit) current supplied to the electric motor 15 is prevented from being set to an excessively high level, which would otherwise excessively suppress the amount of power supplied to other electrical control systems ES. As a result, the limited power of the battery 60 can be distributed to the electrical control systems ES in a well-balanced manner.

10. In the case where the period between the turning off operation of the ignition switch 80 and the next turning on operation of the ignition switch 80 exceeds a predetermined time, the results of the battery condition diagnosis performed up to the previous time are invalidated, and the maximum (upper limit) current $I_{asmax}$ set in accordance with the deterioration degree D is ignored. Therefore, control using incorrect diagnosis results can be prevented.

11. In the case where the battery 60 is determined to have deteriorated when the start conditions of the battery condition diagnosis are checked (before start of electrification), the diagnosis is ended at that time. Therefore, the consumption of electrical power by supply of electricity for the diagnosis can be prevented, and further deterioration of the battery 60 can be prevented (S18 to S20).

12. In the case where the battery voltage becomes lower than a predetermined voltage in the middle of the battery condition diagnosis performed through supply of electricity, the battery condition is determined to be poor, and the supply of electricity is ended at that time. Therefore, it is possible to prevent the residual capacity of the battery from decreasing further, which would otherwise occur due to continued supply of electricity (S57 to S59).

13. In the case where, after supply of electricity to the electric motor 15 is started, the battery voltage is determined to be equal to or higher than a predetermined voltage set in accordance with the amount of supplied electricity, the battery 60 is determined at that time to be in a good condition, and the diagnosis is ended. Therefore, excessive supply of electricity to the electric motor 15 is prevented, and the consumption of electrical power of the battery 60 associated with the diagnosis can be suppressed (S62 to S64).

14. When the battery condition is diagnosed, the removal operation of the ignition key, the open and close operation of the door, and the door locked state are checked as diagnosis start conditions, and in a state in which the driver is estimated to have exited the vehicle, electricity is supplied to the electric motor, whereby safety can be secured (S21 to S24).

In addition, since the steering wheel 11 is not operated by the driver, no regenerative power is generated from the electric motor 15, so that the battery diagnosis is not adversely affected.

In the above, the electric power steering apparatus 1 equipped with the battery condition diagnosis apparatus of the present embodiment has been described. Next, another embodiment regarding the above-described diagnosis-time motor electrifying routine of step S5 will be described.

Figure 14:
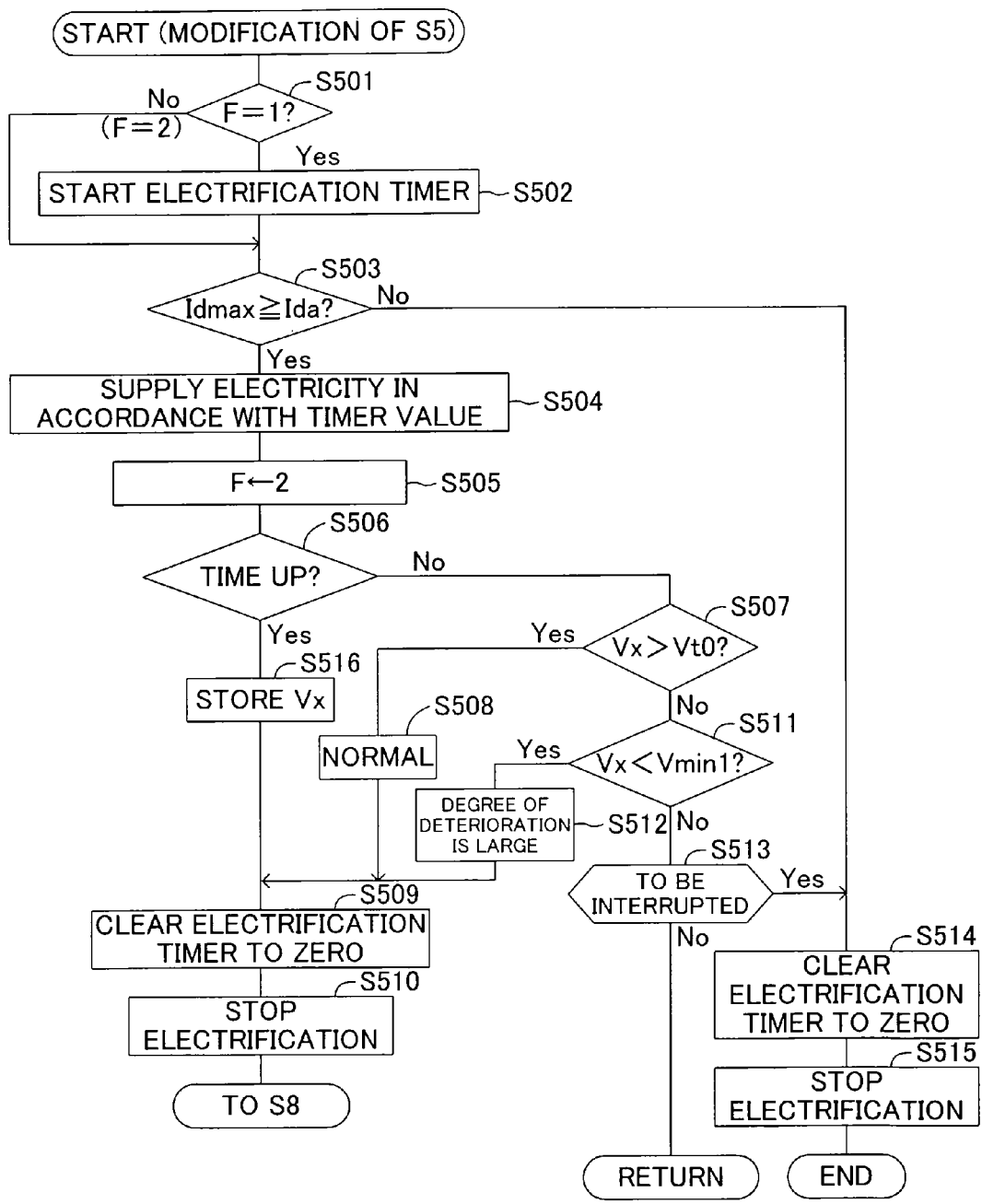
FIG. 14 is a flowchart showing a diagnosis-time motor electrifying routine according to another embodiment.

FIG. 14 shows the diagnosis-time motor electrifying routine according to the second embodiment, which is stored in the ROM Of the electronic control apparatus 40 as a control program, and executed at predetermined intervals.

First, the electronic control apparatus 40 determines whether or not the flag F is "1" (S501). Since the flag F has been set to "1" in the above-described step S17 before the present routine is started, the electronic control apparatus 40 inevitably makes a "Yes" determination in step S501. Notably, the flag F is set to "1" before the supply of electricity, and to "2" during the supply of electricity.

Subsequently, the electronic control apparatus 40 proceeds to step S502 so as to start an electrification timer. This electrification timer measures a time elapsed after start of electrification. Current corresponding to the timer value of the electrification timer is supplied to the electric motor 15 (S504).

Figure 15:
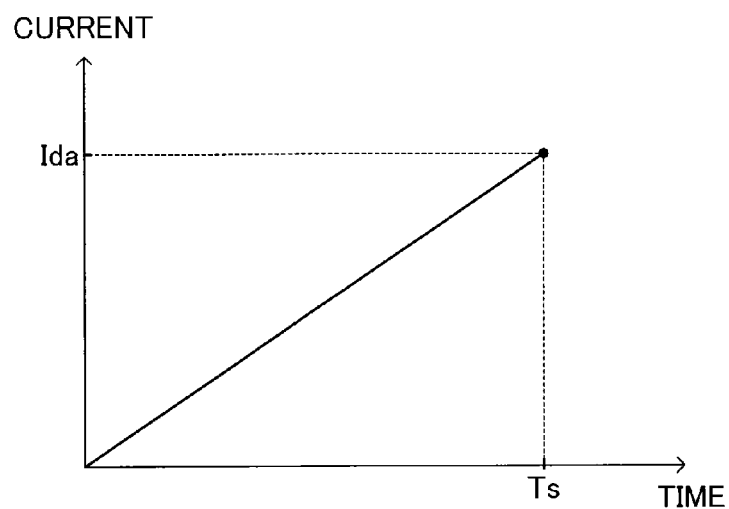
FIG. 15 is a graph showing change in supplied current.

The current corresponding to the timer value is determined on the basis of the map of FIG. 15. In the present embodiment, the electrification time Ts is set to 5 seconds, and the current is gradually increased (in proportion to the elapsed time, for example) such that the d-axis armature current Ida after elapse of 5 seconds becomes 50 A.

However, in step S503, the electronic control apparatus 40 determines whether or not the maximum d-axis armature current $Id_{max}$ set in correspondence to the motor temperature is at least the d-axis armature current Ida after elapse of 5 seconds, and when $Id_{max}$<Ida, the electronic control apparatus 40 ends the present diagnosis-time motor electrification routine.

The amount of current supplied to the electric motor 15 is adjusted to a predetermined level through PWM control of the switching elements SW11, SW12, SW21, SW22, SW31, and SW32 of the motor drive circuit 50, which is performed on the basis of the signal from the current sensor 53. In this case as well, the current is supplied to the electric motor 15 in such a manner that only the d-axis armature current in the d-q coordinate system flows, and thus, the electric motor 15 does not rotate, as in the previously described embodiment.

Subsequently, the electronic control apparatus 40 sets the flag F to "2" (S505).

Next, the electronic control apparatus 40 determines whether or not the time measured by means of the electrification timer exceeds a predetermined time Ts (S506), and repeatedly performs the following processing until the measured time exceeds the predetermined time Ts.

First, the electronic control apparatus 40 reads the battery detection voltage Vx, and determines whether or not the detection voltage Vx is higher than a reference voltage Vt0 previously set in accordance with the amount of supplied electricity (S507). When Vx>Vt0, the electronic control apparatus 40 determines that the battery 60 is in a normal condition (S508), clears the electrification timer to zero (S509), stops the supply of electricity to the electric motor 15 (S510), and then proceeds to the battery condition determination routine of step S8.

This previously set reference voltage Vt0 can be considered to correspond to the voltage change curve L1 of FIG. 10. That is, when the voltage change curve of the diagnosed battery 60 is located, in the graph of FIG. 10, above the voltage change curve L1 at the time of normal, the battery 60 is determined to be in a normal condition.

When the electronic control apparatus 40 makes a "No" determination in step S507, the electronic control apparatus 40 determines whether or not the battery detection voltage Vx becomes lower than a preset, predetermined voltage Vmin1 (in the present embodiment, Vmin1=9 V) (S511). When Vx<Vmin1, the electronic control apparatus 40 determines that the battery 60 is in a deteriorated condition (S512), clears the electrification timer to zero (S509), stops the supply of electricity to the electric motor 15 (S510), and then proceeds to the battery condition determination routine of step S8.

For example, in FIG. 10, the voltage change curve L4 corresponds to this case.

Meanwhile, when the electronic control apparatus 40 makes a "No" determination in step S511, the electronic control apparatus 40 determines whether a battery diagnosis interruption condition is detected (S513). When the battery diagnosis interruption condition is detected (that is, when the ignition switch 80 is turned on, the key switch is inserted, the door is opened and closed, or the door is unlocked in the middle of execution of the present control routine), the electronic control apparatus 40 clears the electrification timer to zero (S514), stops the supply of electricity to the electric motor 15 (S515), and ends the present control routine. That is, the electronic control apparatus 40 stops the battery condition diagnosis at this point in time.

When the battery diagnosis interruption condition is not detected, the electronic control apparatus 40 returns to step S501 of the present routine. However, in this case, since the flag F has been set to "2," the electronic control apparatus 40 proceeds from step S501 to step S503, increases the current in accordance with the timer value, and repeats the above-described processing.

When the above-described processing is repeated and the time measured by means of the electrification timer reaches the predetermined time Ts (S506: Yes), the electronic control apparatus 40 reads the battery detection voltage Vx at that time, and stores it in the nonvolatile memory provided in the electronic control apparatus 40 (S516). Subsequently, the electronic control apparatus 4b clears the electrification timer to zero (S509), stops the supply of electricity to the electric motor 15 (S510), and then proceeds to the battery condition determination routine of step S8.

In this case, the battery deterioration degree D is determined on the basis of the battery detection voltage Vx read after elapse of the predetermined time Ts. That is, the battery detection voltage V3x in the battery condition determination routine of the previous embodiment corresponds to the battery detection voltage Vx in the present embodiment. Further, as to the initial battery voltage V3i, the maximum value of the battery detection voltages Vx in the past is stored for updating.

According the diagnosis-time motor electrification routine of the second embodiment, the battery condition is diagnosed through a single-time, continuous supply of electricity to the electric motor 15. Therefore, chemical reaction occurs to a sufficient degree within the battery 60, and the battery condition is diagnosed under conditions close to an environment in which the battery is actually used, whereby the accuracy of the diagnosis results is improved further. That is, during actual travel of the vehicle, current is continuously taken out of the battery 60. In the present embodiment, since the current is taken out over a long time, the diagnosis can be performed under conditions close to the environment of use, so that accurate diagnosis results are obtained.

In the above, the electric power steering apparatus 1 equipped with the battery condition diagnosis apparatus of the present embodiment has been described. However, the present invention is not limited to the above-described embodiments, and may be modified in various manners without departing from the scope of the present invention.

For example, in the above-described embodiments, the battery condition diagnosis (supply of electricity) is started when a predetermined time elapses after the ignition switch 80 is turned off. However, the timing at which the diagnosis is started may be determined by means of detecting a specific physical phenomenon, rather than by measuring the passage of time by use of a timer. For example, passage of the predetermined time may be determined by means of detecting that the ambient temperature of the engine decreases to a predetermined temperature after the ignition switch 80 is turned off.

The removal operation of the ignition key, the open and close operation of the door, and the door locked state are checked as diagnosis start conditions. However, such checking is not necessarily required, and a portion of the diagnosis start conditions may be checked.

In the present embodiment, the battery condition diagnosis is performed by use of the electric power steering apparatus 1. However, use of the electric power steering apparatus 1 is not necessary required. For example, the diagnosis can be performed by use of an electric-control-type suspension apparatus or an electric-control-type brake apparatus.

Further, the current sensor 53 of the motor drive circuit 50 is not necessarily required to be used for measurement of the current supplied to the electric motor 15. For example, a current sensor may be provided at a battery terminal portion 61 so as to measure the supplied current.

The numerical values such as voltages, currents, times, and the number of times of electrification in the embodiments are merely examples, and may be set arbitrarily.

The invention claimed is:

1. A battery condition diagnosis apparatus for diagnosing a condition of a battery which supplies electrical power to a plurality of electrical control systems provided in a vehicle, comprising:
   electrification means for supplying electricity, in a predetermined manner, to a specific one of the plurality of electrical control systems when a predetermined time elapses after an ignition switch is turned off;
   electricity-supplied-amount detection means for detecting, as an electricity supplied amount, an amount of current flowing through the specific one of the plurality of electrical control systems;
   voltage change detection means for detecting a voltage change of the battery when the electrification means supplies electricity to the specific one of the plurality of electrical control systems; and
   battery condition diagnosis means for diagnosing the condition of the battery based on a detected electricity supplied amount and a detected voltage change of the battery,
   wherein the battery condition diagnosis apparatus determines, prior to a battery condition diagnosis, whether a diagnosis start condition is satisfied, and
   wherein at least one of a determination that an ignition key has been removed, a determination that a door of the vehicle has been opened and closed, and a determination that the door has been locked, satisfies the diagnosis start condition.

2. The battery condition diagnosis apparatus according to claim 1, wherein the electrification means gradually increases an amount of electricity supplied to the specific one of the plurality of electrical control systems.

3. The battery condition diagnosis apparatus according to claim 2, further comprising:
   pre-electrification voltage detection means for detecting battery voltage before the electrification means supplies electricity to the specific one of the plurality of electrical control systems; and
   electrification diagnosis permission means for permitting electricity to be supplied by the electrification means, only when the battery voltage before electricity is supplied is equal to or higher than a reference voltage, to thereby start the battery condition diagnosis.

4. The battery condition diagnosis apparatus according to claim 2, wherein, after the battery condition diagnosis is started upon supply of electricity by the electrification means, when a battery voltage becomes lower than a predetermined voltage during the battery condition diagnosis, the battery condition diagnosis means stops the supply of electricity by the electrification means, and ends the battery condition diagnosis.

5. The battery condition diagnosis apparatus according to claim 2, wherein, after the battery condition diagnosis is started upon supply of electricity by the electrification means, when a battery voltage is equal to or higher than a predetermined voltage set in accordance with the electricity supplied amount, the battery condition diagnosis means determines that the battery is in a good condition, stops the supply of electricity by the electrification means, and ends the battery condition diagnosis.

6. The battery condition diagnosis apparatus according to claim 1, wherein the specific one of the plurality of electrical control systems is an electric power steering apparatus including
   an electric motor that imparts a predetermined steering torque to a steerable wheel to be steered, and
   motor control means for controlling the electric motor in accordance with an operation condition of a steering wheel while detecting an amount of electricity supplied to the electric motor by a current sensor.

7. The battery condition diagnosis apparatus according to claim 6, wherein the electric motor is a brushless DC motor; and
   wherein the motor control means serves as the electrification means so as to supply electricity to the electric motor at a time of the battery condition diagnosis such that only d-axis armature current flows in a d-q coordinate system composed of a d-axis, which is an axis of action of magnetic flux produced by a permanent magnet of a rotor of the brushless DC motor, and a q-axis perpendicular to the d-axis, and that no q-axis armature current flows.

8. The battery condition diagnosis apparatus according to claim 6, wherein the motor control means intermittently supplies electricity to the electric motor.

9. The battery condition diagnosis apparatus according to claim 6, wherein the motor control means continuously supplies electricity to the electric motor.

10. The battery condition diagnosis apparatus according to claim 6, further comprising upper limit current determination means for determining, based on the battery condition diagnosis, an upper limit current which can be supplied to the electric motor of the electric power steering apparatus.

11. The battery condition diagnosis apparatus according to claim 6, wherein the motor control means supplies electricity to the electric motor of the electric power steering apparatus after confirming, based on a detection signal from key detection means for detecting insertion and removal of an ignition key, that the ignition key has been removed, which satisfies the diagnosis start condition.

12. The battery condition diagnosis apparatus according to claim 1, further comprising storage means for storing battery voltage change data representing the voltage change of the battery at a time of the battery condition diagnosis, wherein the detected voltage change of the battery includes stored past battery voltage change data and the voltage change of the battery at the time of the battery condition diagnosis.

13. The battery condition diagnosis apparatus according to claim 12, wherein when a period between a turning off operation of the ignition switch and a next turning on operation of the ignition switch exceeds a predetermined time, results of the battery condition diagnosis performed up to a previous time are invalidated.

14. The battery condition diagnosis apparatus according to claim 1, wherein a determination that an ignition key has been removed, a determination that a door of the vehicle has been opened and closed, and a determination that the door has been locked, are all required to satisfy the diagnosis start condition.

15. A battery condition diagnosis apparatus for a vehicle, comprising:
vehicle-condition control means including an electric motor and motor control means for driving and controlling the electric motor and adapted to control a condition of the vehicle; and
a battery that supplies electrical power to the vehicle-condition control means,
wherein the battery condition diagnosis apparatus diagnoses a condition of the battery based on a voltage change of the battery when electricity is supplied from the battery to the electric motor,
wherein the electric motor is composed of a brushless DC motor, and
wherein the motor control means includes d-axis electrification control means for supplying electricity to the electric motor at a time of a battery condition diagnosis such that only d-axis armature current flows in a d-q coordinate system composed of a d-axis, which is an axis of action of magnetic flux produced by a permanent magnet of a rotor of the brushless DC motor, and a q-axis perpendicular to the d-axis, and that no q-axis armature current flows.

16. The battery condition diagnosis apparatus according to claim 15, wherein the d-axis electrification control means restricts the d-axis armature current to a predetermined upper limit current value or less.

17. The battery condition diagnosis apparatus according to claim 16, further comprising temperature detection means for detecting a temperature of the brushless DC motor through measurement or estimation,
wherein the d-axis electrification control means sets the upper limit current value based on a detected temperature.

18. The battery condition diagnosis apparatus according to claim 15, wherein the vehicle condition control means is an electric power steering apparatus which drives and controls the brushless DC motor in accordance with an operation condition of a steering wheel so as to impart a predetermined steering force to steerable wheels to be steered.

* * * * *